(12) United States Patent
Shibata

(10) Patent No.: US 7,843,723 B2
(45) Date of Patent: Nov. 30, 2010

(54) SEMICONDUCTOR MEMORY DEVICE CAPABLE OF READING DATA RELIABLY

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 743 days.

(21) Appl. No.: 11/780,656

(22) Filed: Jul. 20, 2007

(65) Prior Publication Data

US 2008/0313387 A1 Dec. 18, 2008

(30) Foreign Application Priority Data

Jul. 31, 2006 (JP) .............................. 2006-209156

(51) Int. Cl.
*G11C 16/04* (2006.01)
(52) U.S. Cl. ............................ 365/185.03; 365/185.18; 365/185.23
(58) Field of Classification Search ............ 365/185.03, 365/185.17, 185.18, 185.22, 185.23, 185.24, 365/185.29
See application file for complete search history.

(56) References Cited

U.S. PATENT DOCUMENTS

| 6,657,891 | B1 | 12/2003 | Shibata et al. |
| 6,975,542 | B2 * | 12/2005 | Roohparvar ............ 365/185.22 |
| 7,079,419 | B2 * | 7/2006 | Roohparvar ............ 365/185.22 |
| 7,110,292 | B2 * | 9/2006 | Hahn et al. ............. 365/185.03 |
| 2006/0044923 | A1 * | 3/2006 | Hahn et al. ............. 365/230.06 |

FOREIGN PATENT DOCUMENTS

JP 2004-192789 7/2004

* cited by examiner

*Primary Examiner*—Gene N. Auduong
(74) *Attorney, Agent, or Firm*—Oblon, Spivak, McClelland, Maier & Neustadt, L.L.P.

(57) ABSTRACT

A control unit reads data from a plurality of memory cells connected to one of the word lines in a read operation at a first level CR generated by a voltage generator circuit and in a read operation at a second level CR−x and finds the number of cells included between the first level and the second level from the data and, if the number is equal to or smaller than a specified value, determines the result of the read operation at the first level to be read data.

18 Claims, 32 Drawing Sheets

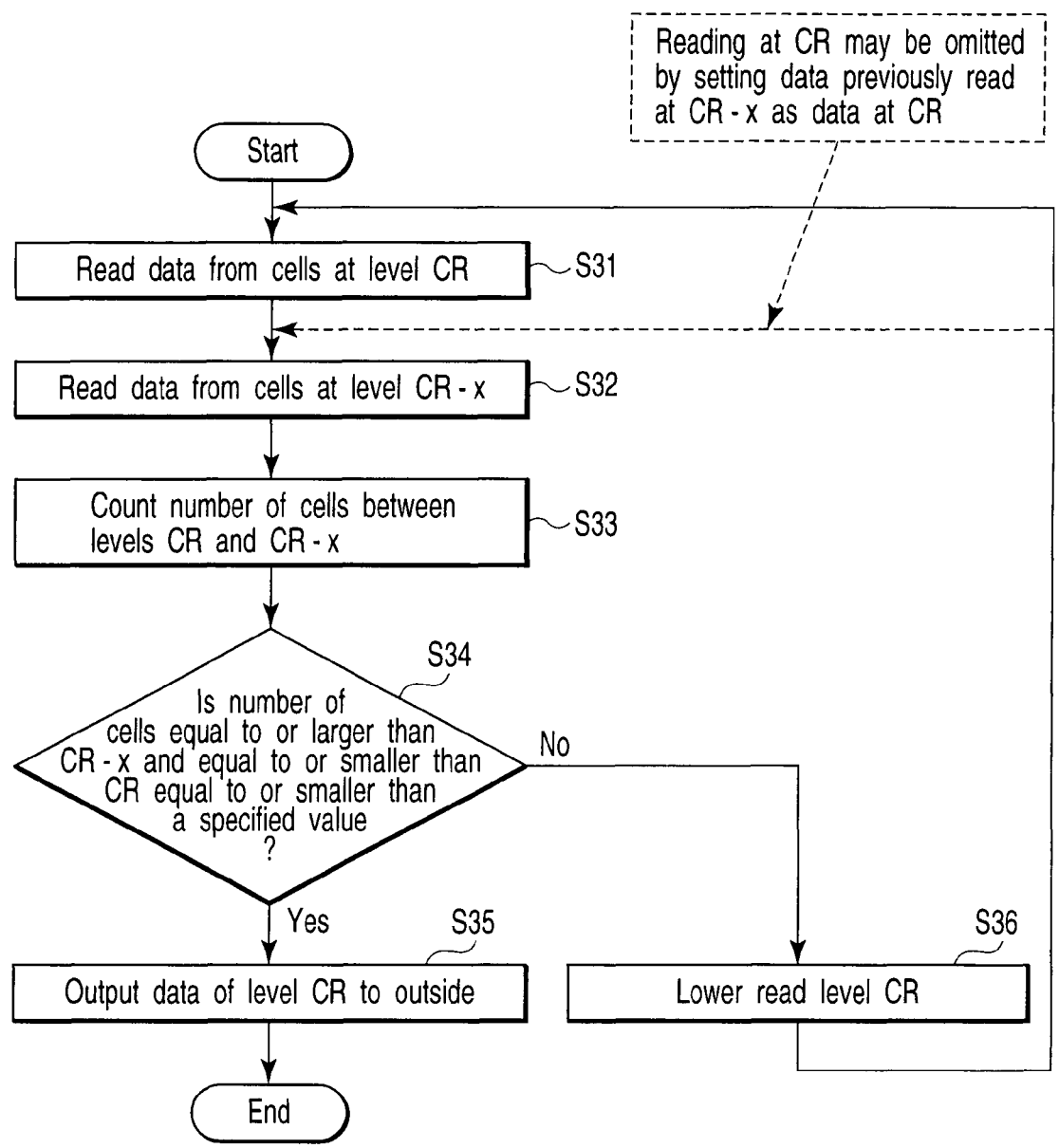
F I G. 1

|  | Cell (P-well) | Cell (N-well) | H.V.Tr (P-sub) | L.V.Nch (P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V) / Vpgmh |
| Read | Vfix (1.6V) | Vfix (1.6V) | Vss (0V) | Vss (0V) | Vdd (2.5V) | Vdd (2.5V) / Vreadh+Vfix |

F I G. 7

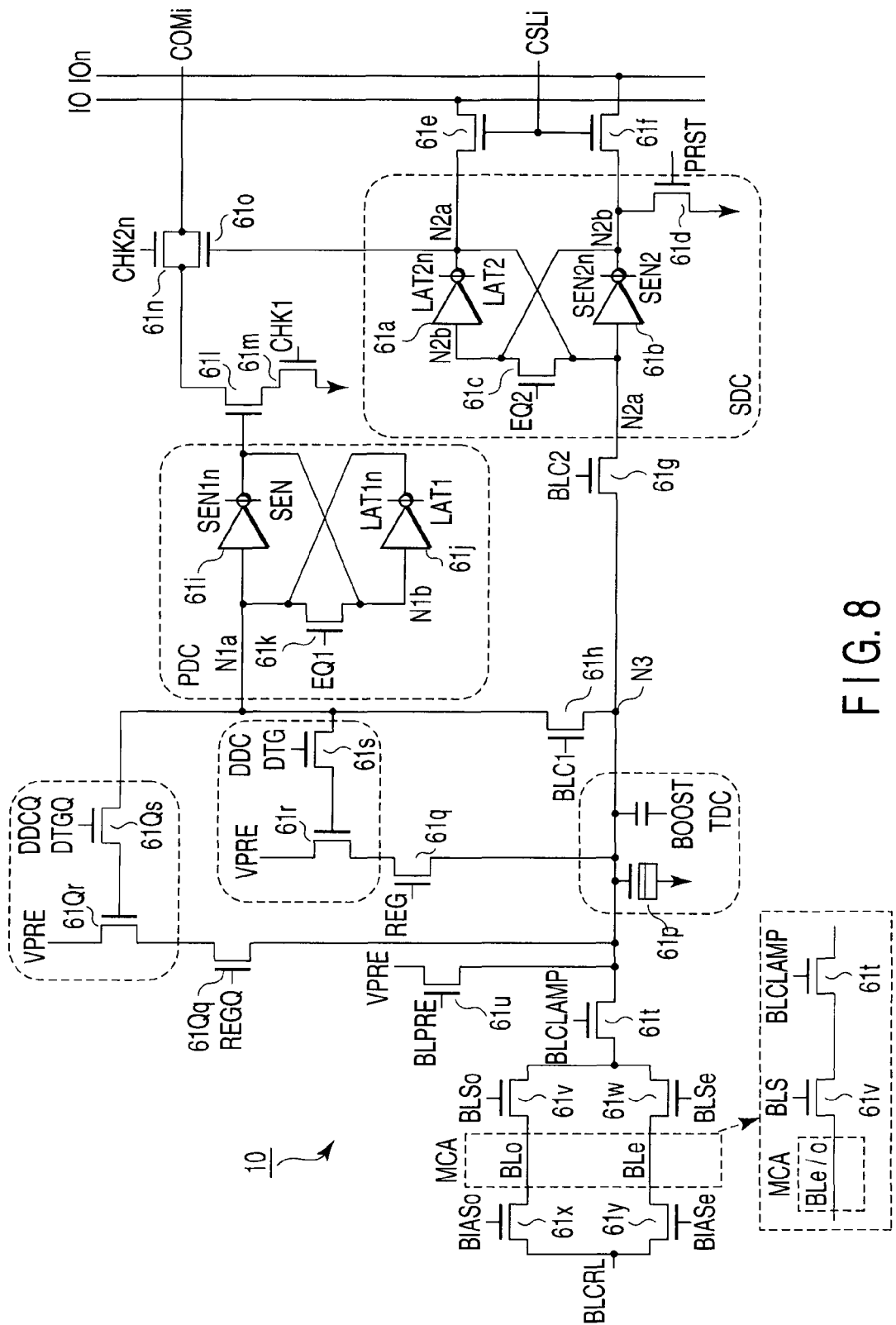
F I G. 8

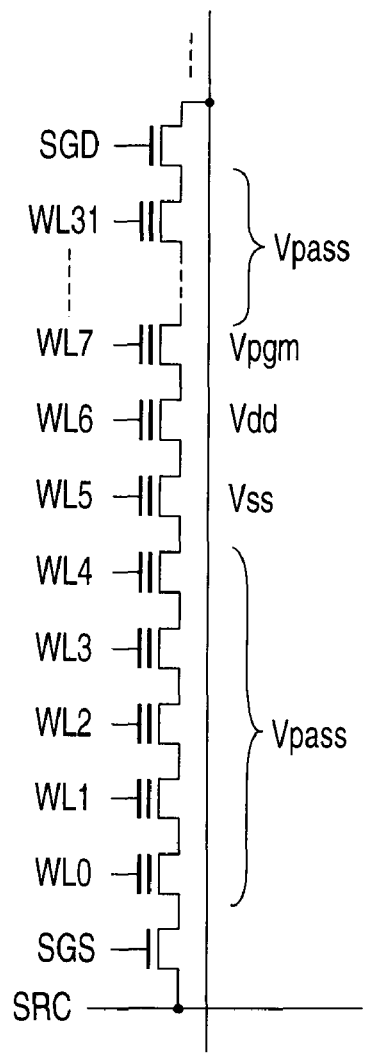
FIG. 13
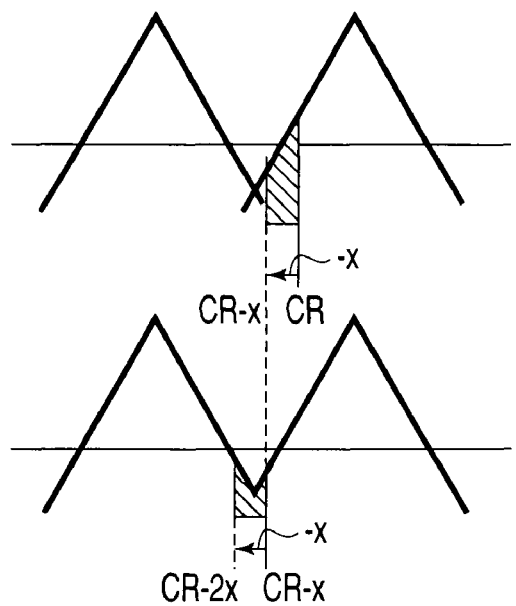
FIG. 14A
FIG. 14B

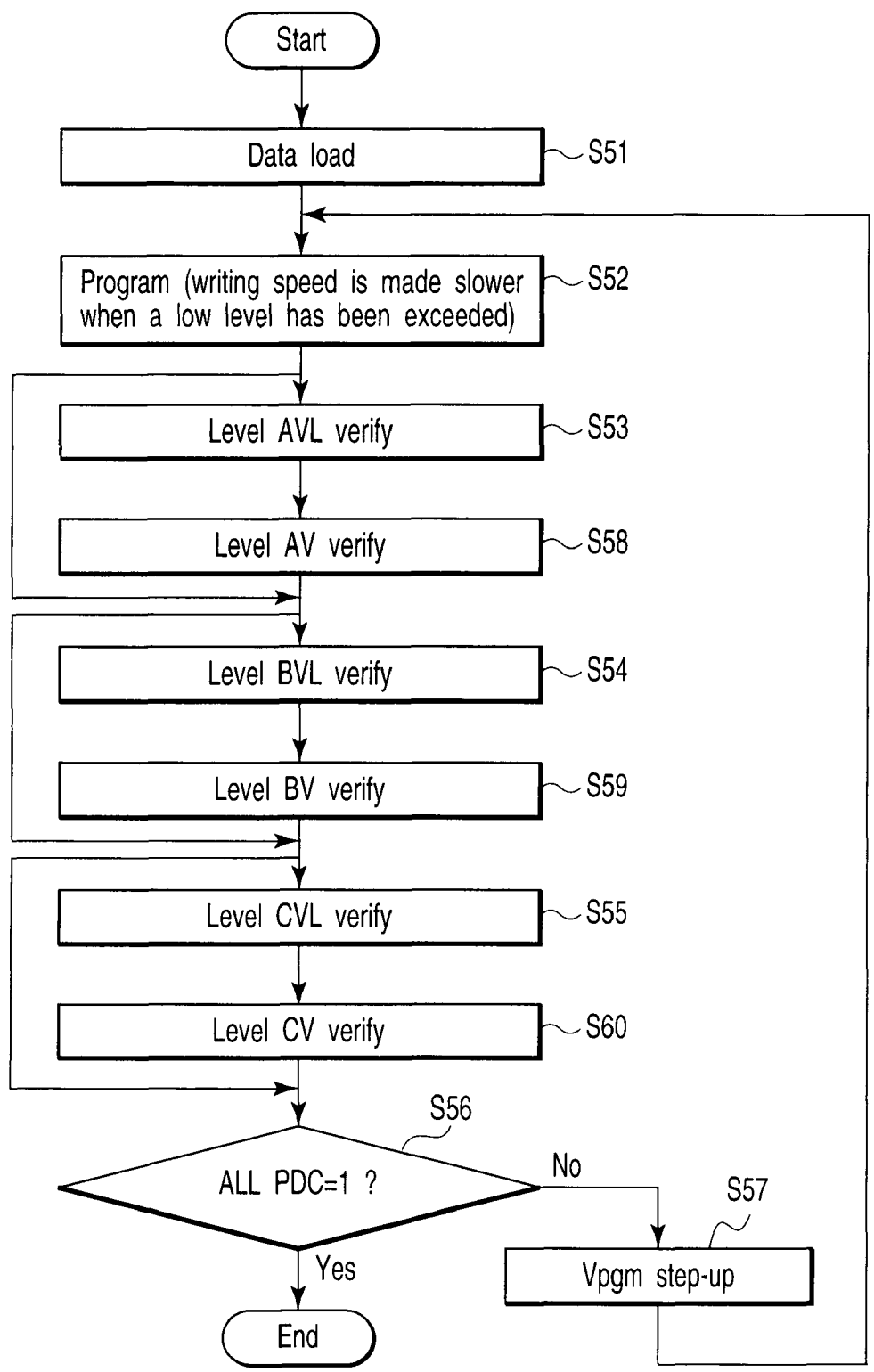
F I G. 2 4

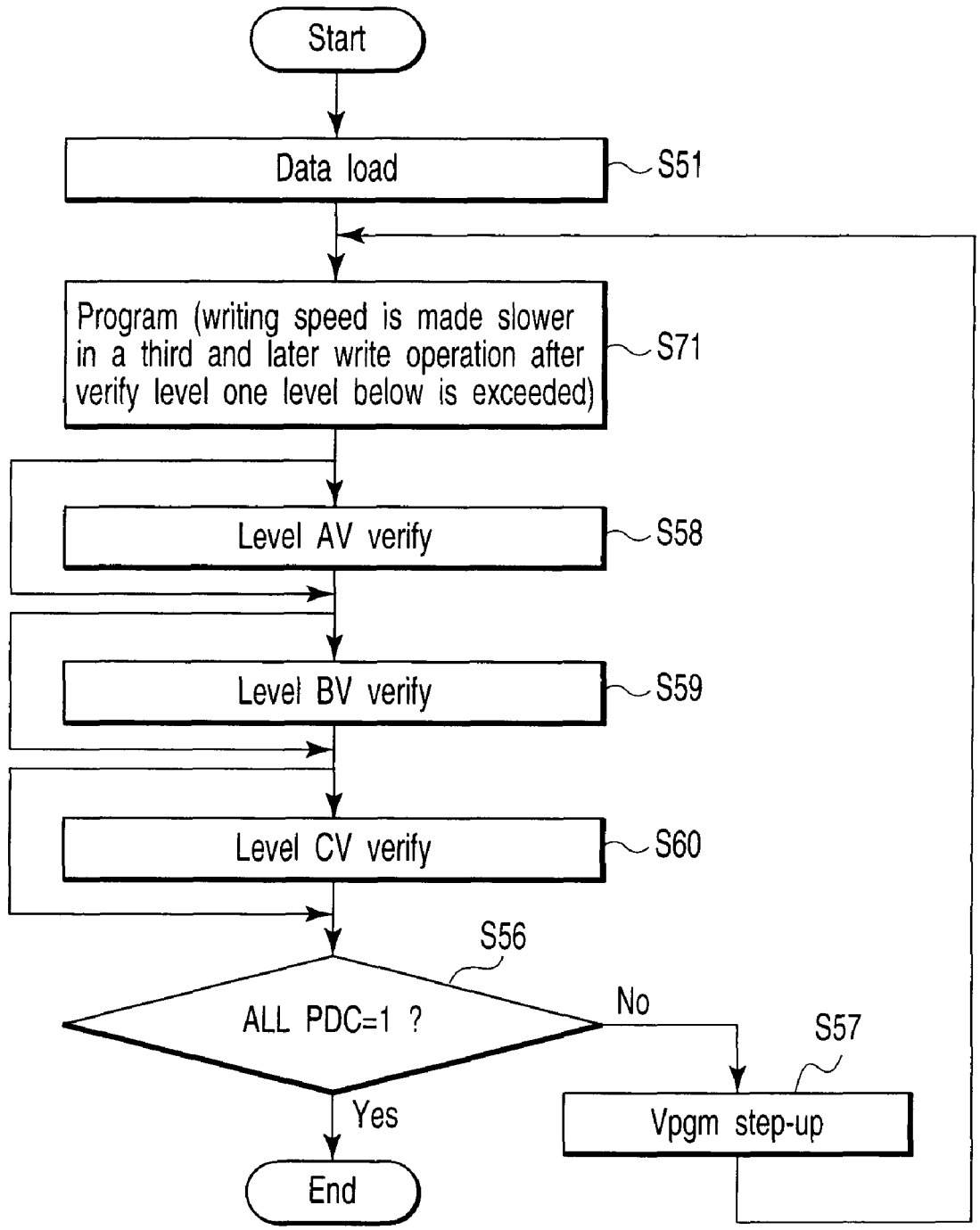
F I G. 2 6

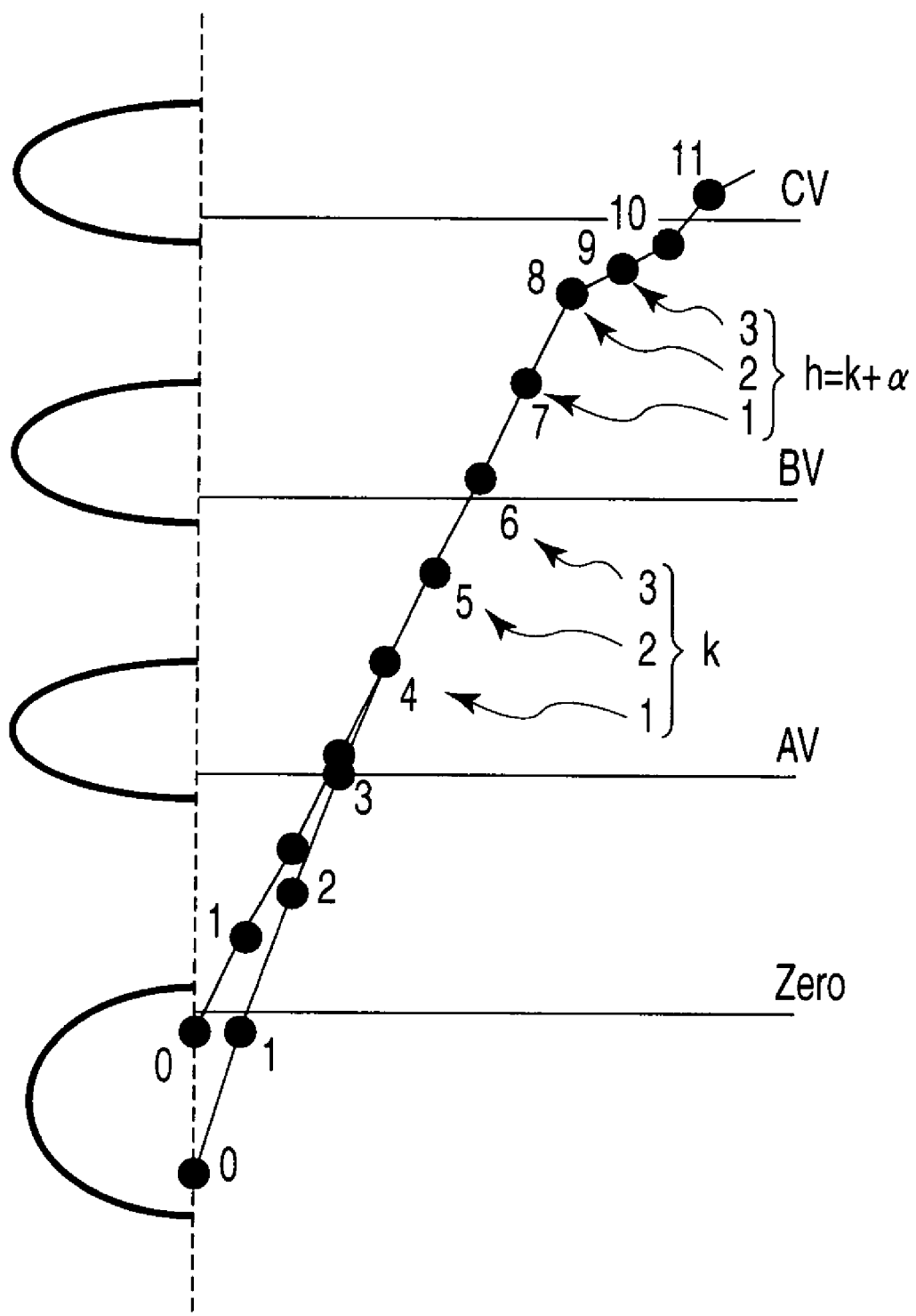
F I G. 29

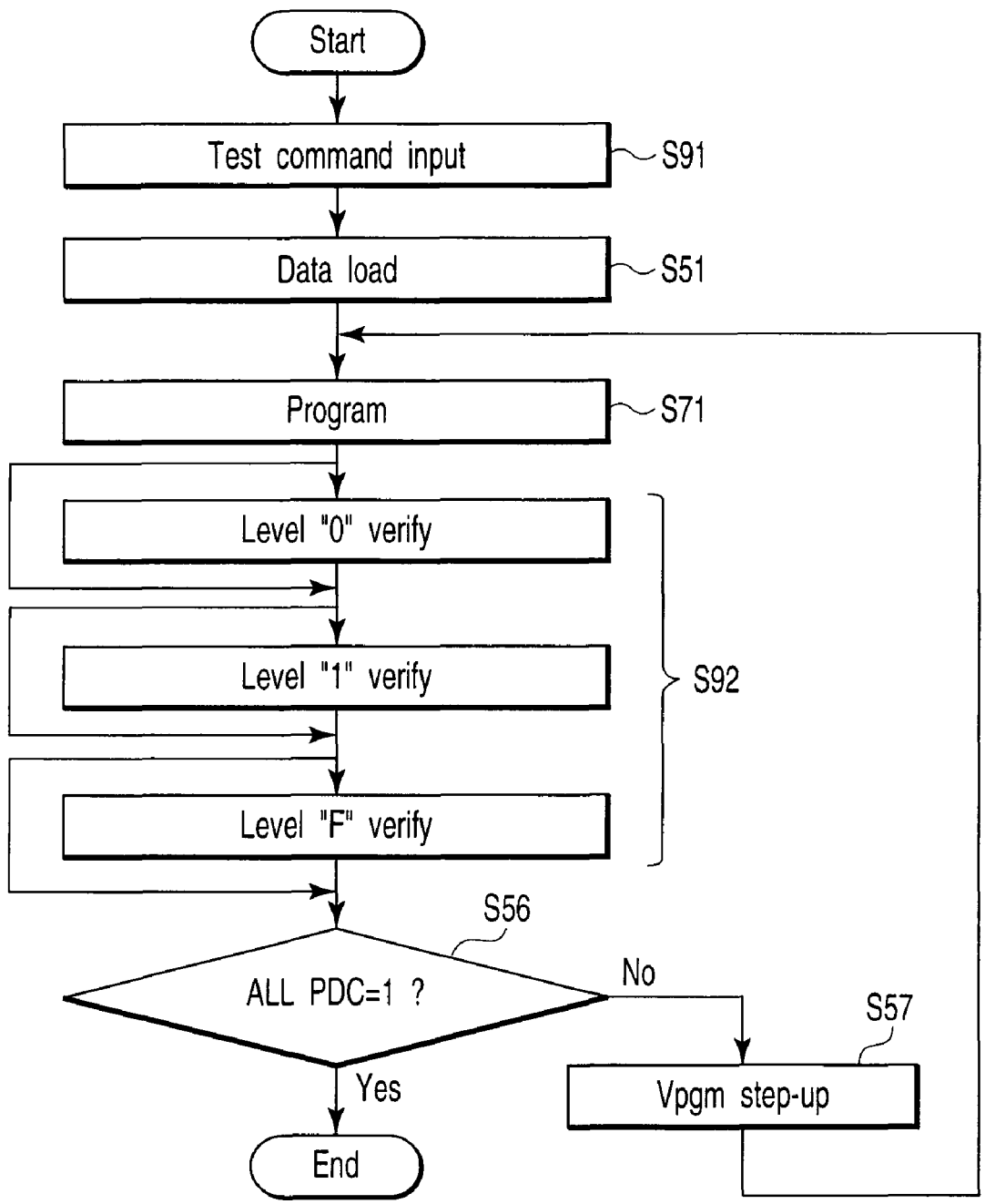
F I G. 3 4

SEMICONDUCTOR MEMORY DEVICE CAPABLE OF READING DATA RELIABLY

CROSS-REFERENCE TO RELATED APPLICATIONS

This application is based upon and claims the benefit of priority from prior Japanese Patent Application No. 2006-209156, filed Jul. 31, 2006, the entire contents of which are incorporated herein by reference.

BACKGROUND OF THE INVENTION

1. Field of the Invention

This invention relates to a nonvolatile semiconductor memory device capable of storing 2 or more levels of data in, for example, a single memory cell.

2. Description of the Related Art

For example, in a NAND flash memory, each of a plurality of memory cells arranged in the row direction is connected via a bit line to the corresponding latch circuit. Each latch circuit holds data in writing or reading data. All of or half of the cells (e.g., 2 to 4 KB of cells) arranged in the row direction are written to or read from simultaneously. The threshold voltage of a memory cell is set to a negative voltage in an erase operation and electrons are injected into the memory cell in a write operation, thereby setting the threshold voltage to a positive voltage (e.g., refer to Jpn. Pat. Appln. KOKAI Publication No. 2004-192789).

Since in the NAND flash memory, a plurality of memory cells are connected in series, it is necessary to turn on the unselected cells in a read operation. Thus, in a read operation, a voltage (Vread) higher than the threshold voltage is applied to the gate electrode. For this reason, the threshold voltage in a write operation must not exceed Vread. In a write sequence, a program operation and a program verify operation have to be carried out repeatedly for each memory cell so as to perform control to prevent the threshold voltage of the memory cell from exceeding Vread. This causes the problem of decreasing the writing speed.

To store large volumes of data, a multilevel memory capable of storing 2 bits or more in a cell has been developed. For example, to store 2 bits in a cell, it is necessary to set four threshold voltage distributions. For this reason, each of the threshold voltage distributions has to be set narrower than in a memory which stores one bit in a cell, which causes the problem of decreasing the writing speed further.

When the level of the read voltage Vread is raised, a high Vread is applied in a read operation, which causes a problem: erroneous writing is done. Moreover, when an attempt is made to write data at a higher one of the plurality of threshold voltages, a higher writing voltage is required. Since all of or half of the cells arranged in the row direction are written to simultaneously in the NAND flash memory, a high voltage is also applied to the unwritten cells, depending on data, which causes the problem of erroneous writing.

To avoid the problems, 4-level data requires four threshold voltage distributions to be set, 8-level data requires eight threshold voltage distributions to be set, and 16-level data requires 16 threshold voltage distributions in a limited threshold voltage range, for example, in the range of −2 to 5 V. With the recent improvement in the error correction capability by means of an error-correcting code (ECC), the threshold voltage distribution width can be set narrower and the data retention margin can be set smaller than before.

However, conditions, including temperature, in a program verify operation differ from those in a read operation. Moreover, a write voltage, a verify voltage, and a read voltage set by trimming the resistance of a voltage generator circuit in the die sort testing might shift with respect to the target voltage. For this reason, a margin of about 80 mV has to be set between threshold voltage distributions. Therefore, although the correcting capability of ECC has been increased and each threshold voltage distribution width has been made apparently narrower, the setting margin remains large.

As described above, in a multilevel memory where a plurality of threshold voltages are set, it is better to set a margin between threshold voltages narrower. However, since conditions, including temperature, in a program verify operation differ from those in a read operation and there is a shift in the read voltage, write voltage, and verify voltage, some margin has to be set. Accordingly, even when the margin between threshold voltage distributions is narrow, a semiconductor memory device capable of reading stored data reliably has been desired.

BRIEF SUMMARY OF THE INVENTION

According to a first aspect of the invention, there is provided a semiconductor memory device comprising: a memory cell array in which a plurality of memory cells connected to a plurality of word lines and to a plurality of bit lines are arranged in a matrix; a voltage generator circuit which generates potentials for the word lines and the bit lines; a data storage circuit which is connected to the bit lines and which stores data to be written to the memory cells or data read from the memory cells; and a control unit which reads data from a plurality of memory cells connected to one of the word lines in a read operation at a first level generated by the voltage generator circuit and in a read operation at a second level and which finds the number of cells included between the first level and the second level from the read data and, if the number is equal to or smaller than a specified value, determines the result of the read operation at the first level to be read data.

According to a second aspect of the invention, there is provided a semiconductor memory device comprising: a memory cell array in which a plurality of memory cells connected to a plurality of word lines and to a plurality of bit lines are arranged in a matrix; a voltage generator circuit which generates potentials for the word lines and the bit lines; a data storage circuit which is connected to the bit lines and which stores data to be written to the memory cells or data read from the memory cells; and a control unit which, in a read operation at a first level generated by the voltage generator circuit, a read operation at a second level, and a read operation at a third level higher than the first level, finds the number of memory cells included between the first level and the second level and the number of memory cells included between the first level and the third level and which determines the result of the read operation at the first level to be read data when (number of memory cells included between first level and second level)/(number of memory cells included between first level and third level) is equal to or smaller than a specified number.

According to a third aspect of the invention, there is provided a semiconductor memory device comprising: a memory cell array in which a plurality of memory cells connected to a plurality of word lines and to a plurality of bit lines are arranged in a matrix; a voltage generator circuit which generates potentials for the word lines and the bit lines; a data storage circuit which is connected to the bit lines and which stores data to be written to the memory cells or data read from the memory cells; and a control unit which controls the voltage generator circuit and the data storage circuit and which sets the threshold voltage of the memory cells at a first level in an erase operation and, according to externally input write data, sets the threshold voltage of the memory cells at the first level, a second level, . . . , an n-th level (n=$2^k$) by repeating a write and verify operation, stores k bits of data, counts a j number of write operations (j is a natural number) for the cells that have exceeded an (h−b)-th level (1≦b≦h, b is a natural number) of the cells to be written at an h-th level (h≦n) after the (h−b)-th level has been exceeded, and makes the writing speed slower or no writing in the j-th and later write operations.

According to a fourth aspect of the invention, there is provided a semiconductor memory device comprising: a memory cell array in which a plurality of memory cells connected to a plurality of word lines and to a plurality of bit lines are arranged in a matrix; a voltage generator circuit which generates potentials for the word lines and the bit lines; a data storage circuit which is connected to the bit lines and which stores data to be written to the memory cells or data read from the memory cells; and a control unit which controls the voltage generator circuit and the data storage circuit and which sets the threshold voltage of the memory cells at a first level in an erase operation and, according to externally input write data, sets the threshold voltage of the memory cells at the first level, a second level, . . . , an n-th level (n=$2^k$) by repeating a write and verify operation, stores k bits of data, counts an i number of write operations (i is a natural number) from when an (h−c)-th level is exceeded until an (h−b)-th level (1≦b<c<h, b and c are a natural number) is exceeded with respect to the cells to be written at an h-th level (h≦n), and makes the writing speed slower or no writing in the j-th and later write operations (j=i+α) (α is a natural number including "0") for the cells that have exceeded the (h−b)-th level in a write operation at the h-th level.

According to a fifth aspect of the invention, there is provided a semiconductor memory device comprising: a memory cell array in which a plurality of memory cells connected to a plurality of word lines and to a plurality of bit lines are arranged in a matrix; a voltage generator circuit which generates potentials for the word lines and the bit lines; a data storage circuit which is connected to the bit lines and which stores data to be written to the memory cells or data read from the memory cells; and a control unit which controls the voltage generator circuit and the data storage circuit and which sets the threshold voltage of the memory cells at a first level in an erase operation and, according to externally input write data, sets the threshold voltage of the memory cells at the first level, a second level, . . . , an n-th level (n=$2^k$) by repeating a write and verify operation in a write operation, stores k bits of data in the memory cells, carries out a verify operation for an n number of levels, the first level, second level, . . . , n-th level (n=$2^k$), in the write operation, and carries out only a verify operation for an h number of levels (h<n) of the n number of levels in the write operation after the input of a first command.

According to a sixth aspect of the invention, there is provided a recording and reproducing system comprising: a communication unit which transmits and receives data to and from a data server; a reproducing unit which reproduces multimedia data; a storage unit which stores the multimedia data; and a control unit which controls the communication unit, the reproducing unit, and the storage unit and which transmits a multimedia data purchase request to the data server, receives purchase rights data supplied from the data server, and stores the data in the storage unit and, when reproducing the multimedia data, downloads multimedia data corresponding to the purchase rights data stored in the storage unit from the data server, and not only reproduces the downloaded multimedia data at the reproducing unit but also stores the data in the storage unit.

BRIEF DESCRIPTION OF THE SEVERAL VIEWS OF THE DRAWING

FIG. 1 is a flowchart to explain a read operation in a first embodiment of the invention;

FIG. 7 is a table listing an example of voltages supplied to various parts shown in FIG. 6;

FIG. 8 is a circuit diagram of an example of the data storage circuit shown in FIGS. 3 and 4;

FIG. 13 is a diagram to explain an EASB writing method;

FIGS. 14A and 14B are diagrams to explain a first page read sequence in a memory cell in the first embodiment;

FIG. 24 is a flowchart to schematically explain the quick-pass write (QPW) method;

FIG. 26 is a flowchart to explain a program sequence according to a seventh embodiment of the present invention;

FIG. 29 shows program pulse voltages applied to a cell when writing is done and changes in the threshold voltage in the eighth embodiment;

FIG. 34 is a flowchart to explain a write sequence in die sort testing;

DETAILED DESCRIPTION OF THE INVENTION

Hereinafter, referring to the accompanying drawings, embodiments of the invention will be explained.

Figure 2:
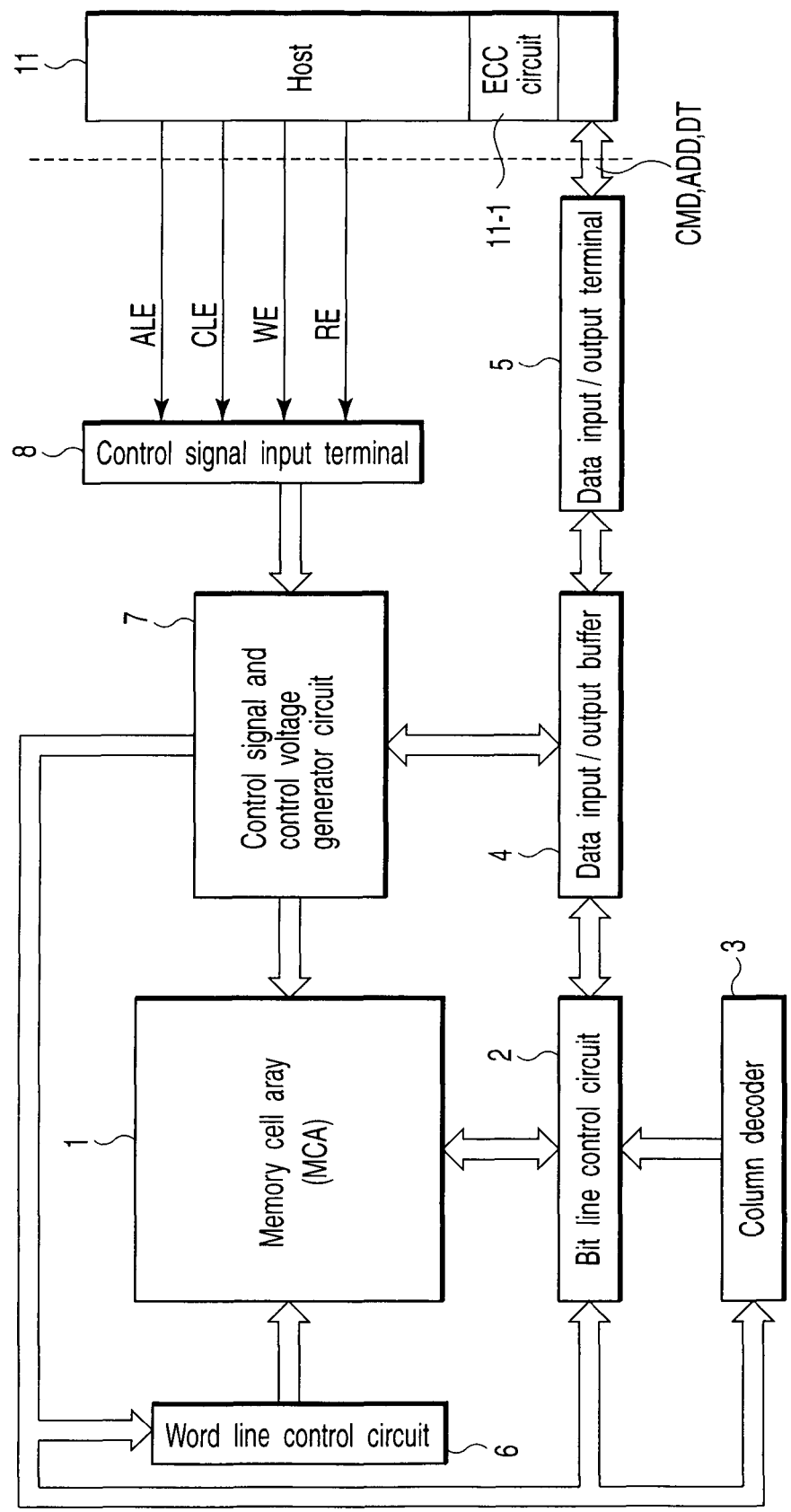
FIG. 2 shows the configuration of a semiconductor memory device applied to each embodiment of the invention.

FIG. 2 shows a configuration of a semiconductor memory device, such as a NAND flash memory for storing 4 levels (2 bits), applied to each embodiment of the invention.

A memory cell array 1 includes a plurality of bit lines, a plurality of word lines, and a common source line. In the memory cell array 1, electrically rewritable memory cells made up of, for example, EEPROM cells are arranged in a matrix. A bit line control circuit 2 for controlling bit lines and a word line control circuit 6 are connected to the memory cell array 1.

The bit line control circuit 2 reads the data in a memory cell of the memory cell array 1 via a bit line, detects the state of a memory cell of the memory cell array 1 via a bit line, and writes data into a memory cell of the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 at a data input/output terminal 5 to the outside. The data input/output terminal 5 is connected to, for example, a host 11 outside the memory chip. The host 11, which is composed of, for example, a microcomputer, receives the data output from the data input/output terminal 5. The controller 11 outputs various commands CMD for controlling the operation of the NAND flash memory, addresses ADD, and data DT. The write data input to the data input/output terminal 5 from the host 11 is supplied via the data input/output buffer 4 to the data storage circuit selected by the column decoder 3. The commands and addresses are supplied to a control signal and control voltage generator circuit 7.

The word line control circuit 6 is connected to the memory cell array 1. The word line control circuit 6 selects a word line in the memory cell array 1 and applies to the selected word line a voltage necessary for a read, write, or erase operation.

The memory cell array 1, bit line control circuit 2, column decoder 3, data input/output buffer 4, and word line control circuit 6 are connected to and controlled by the control signal and control voltage generator circuit 7. The control signal and control voltage generator circuit 7 is connected to a control signal input terminal 8 and is controlled by Address Latch Enable (ALE), Command Latch Enable (CLE), Write Enable (WE), and Read Enable (RE) control signals input from the host 11 via the control signal input terminal 8.

The bit line control circuit 2, column decoder 3, word line control circuit 6, and control signal and control voltage generator circuit 7 constitute a write circuit and a read circuit.

Figure 3:
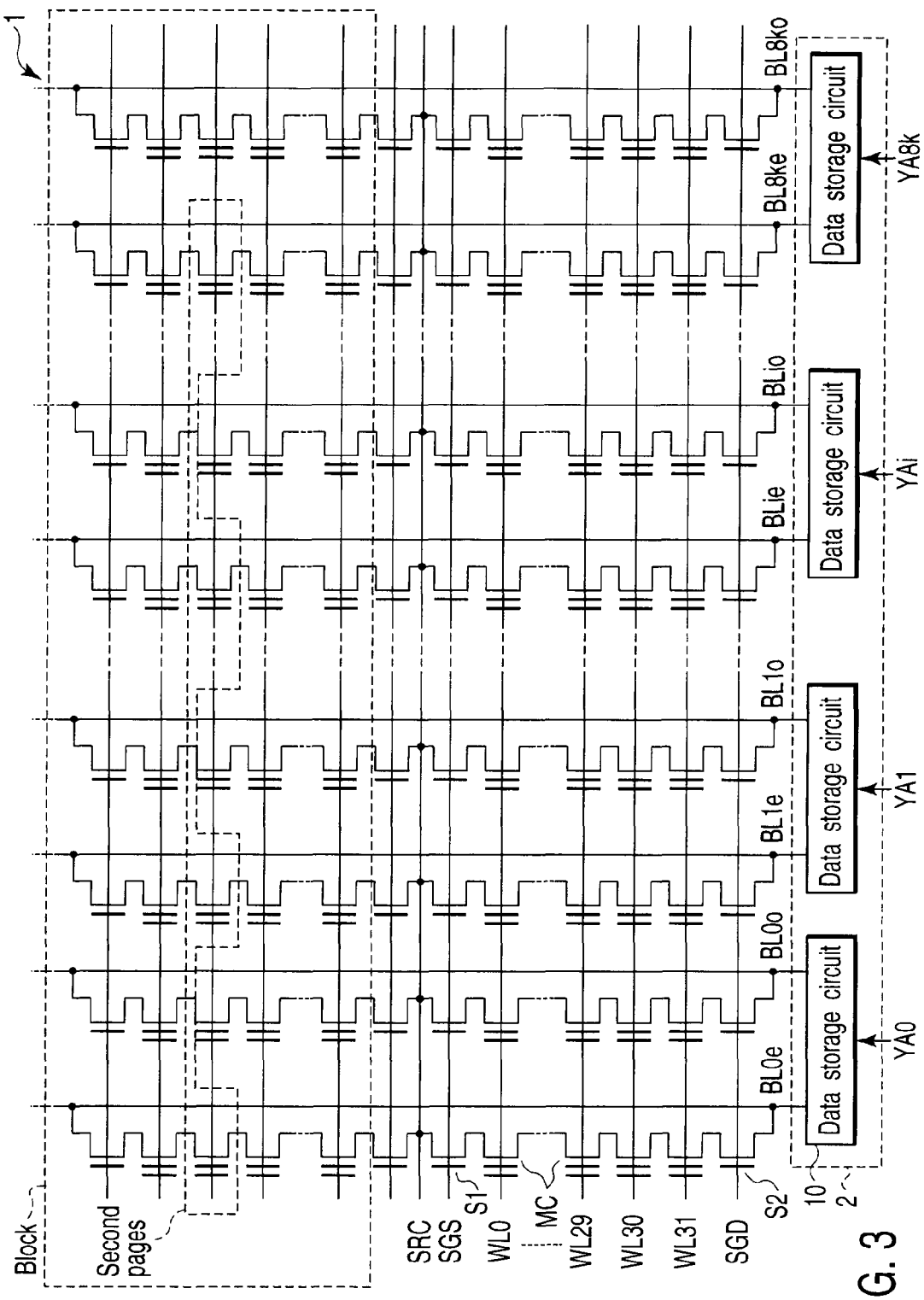
FIG. 3 is a circuit diagram of an example of the memory cell array and bit line control circuit shown in FIG. 2.

FIG. 3 shows a configuration of the memory cell array 1 and bit line control circuit 2 shown in FIG. 2. In the memory cell array 1, a plurality of NAND cells are arranged. A NAND cell is composed of, for example, a memory cell MC made up of, for example, 32 EEPROMs connected in series and select gates S1, S2. Select gate S2 is connected to bit line BL0e and select gate S1 is connected to a source line SRC. The control gates of the memory cells MC arranged in each row are connected equally to word lines WL0 to WL29, WL30, WL31. Select gates S2 are connected equally to select line SGD. Select gates S1 are connected equally to select line SGS.

The bit line control circuit 2 has a plurality of data storage circuits 10. Bit line pairs (BL0e, BL0o), (BL1e, BL1o), ..., (BLie, BLio), (BL8ke, BL8ko) are connected to the individual data storage circuits 10 in a one-to-one correspondence.

The memory cell array 1 includes a plurality of blocks as shown by a broken line. Each block is composed of a plurality of NAND cells. In the memory cell array 1, data is erased in, for example, blocks. An erase operation is performed simultaneously on the two bit lines connected to the data storage circuit 10.

A plurality of memory cells which are arranged every other bit line and are connected to a single word line (or the memory cells enclosed by a broken line) constitute one sector. Data is written or read in sectors.

In a read operation, a program verify operation, and a program operation, one of the two bit lines (BLie, BLio) connected to the data storage circuit 10 is selected according to the address signals (YA0, YA1, ..., YAi, ..., YA8k) externally supplied. Moreover, according to an external address, a single word line is selected.

Furthermore, a single word line is selected according to an external address, with the result that two pages enclosed by a dotted line are selected. Switching between two pages is done by an address. When 2 bits are stored in one cell, two pages are selected; when 3 bits are stored in one cell, three pages are selected; and when 4 bits are stored in one cell, four pages are selected. An erase operation is carried out using a block unit shown by the dotted line in FIG. 3.

Figure 4:
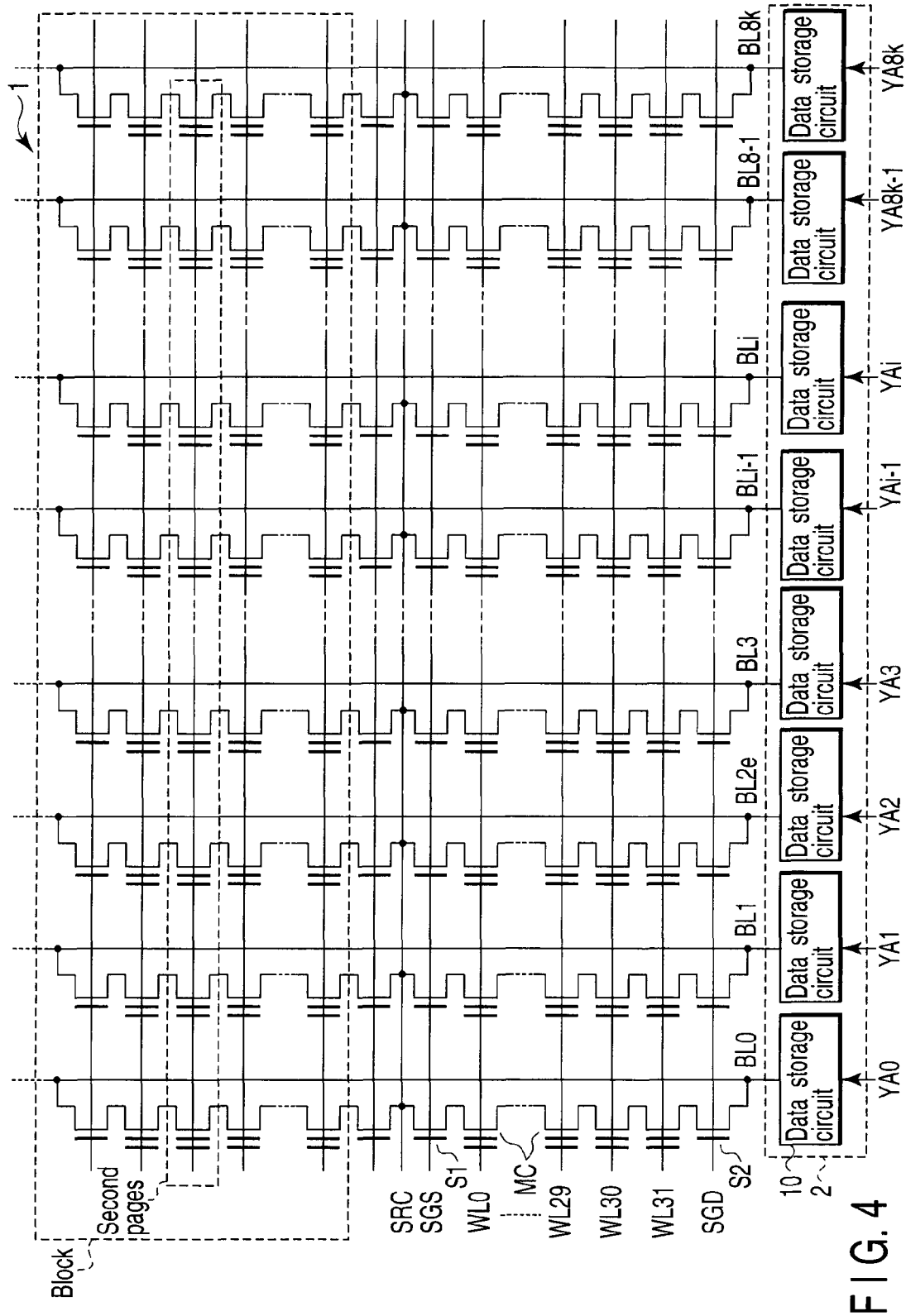
FIG. 4 is a circuit diagram of another example of the memory cell array and bit line control circuit shown in FIG. 2.

FIG. 4 shows a configuration when all the cell arranged in the row direction are written to simultaneously. In this case, the individual bit lines BL0, BL1, ..., BLik−1, BL8k are connected to the data storage circuits 10 in a one-to-one correspondence. Address signals YA0, YA1, ..., YA8k−1, YA8k are connected to the individual data storage circuits 10 in a one-to-one correspondence.

Figure 5A:
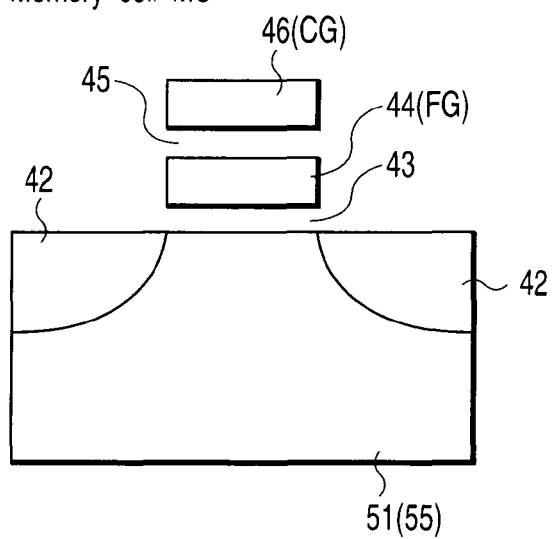
FIG. 5A is a sectional view of a memory cell.
Figure 5B:
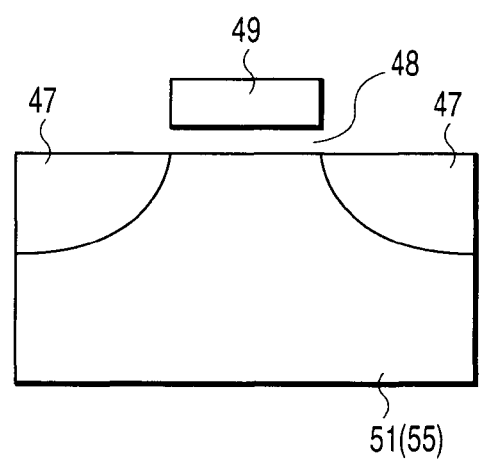
FIG. 5B is a sectional view of a select gate.

FIGS. 5A and 5B show a sectional view of a memory cell and that of a select gate, respectively. In FIG. 5A, an n-type diffused layer 42 acting as the source and drain of a memory cell is formed in a substrate 51 (or a p-well region 55 described later). Above the p-well region 55, a floating gate (FG) 44 is formed via a gate insulating film 43. Above the floating gate 44, a control gate (CG) 46 is formed via an insulating film 45. In FIG. 5B, an n-type diffused layer 47 acting as a source and a drain is formed in the p-well region 55. Above the p-well well region 55, a control gate 49 is formed via a gate insulating film 48.

Figure 6:
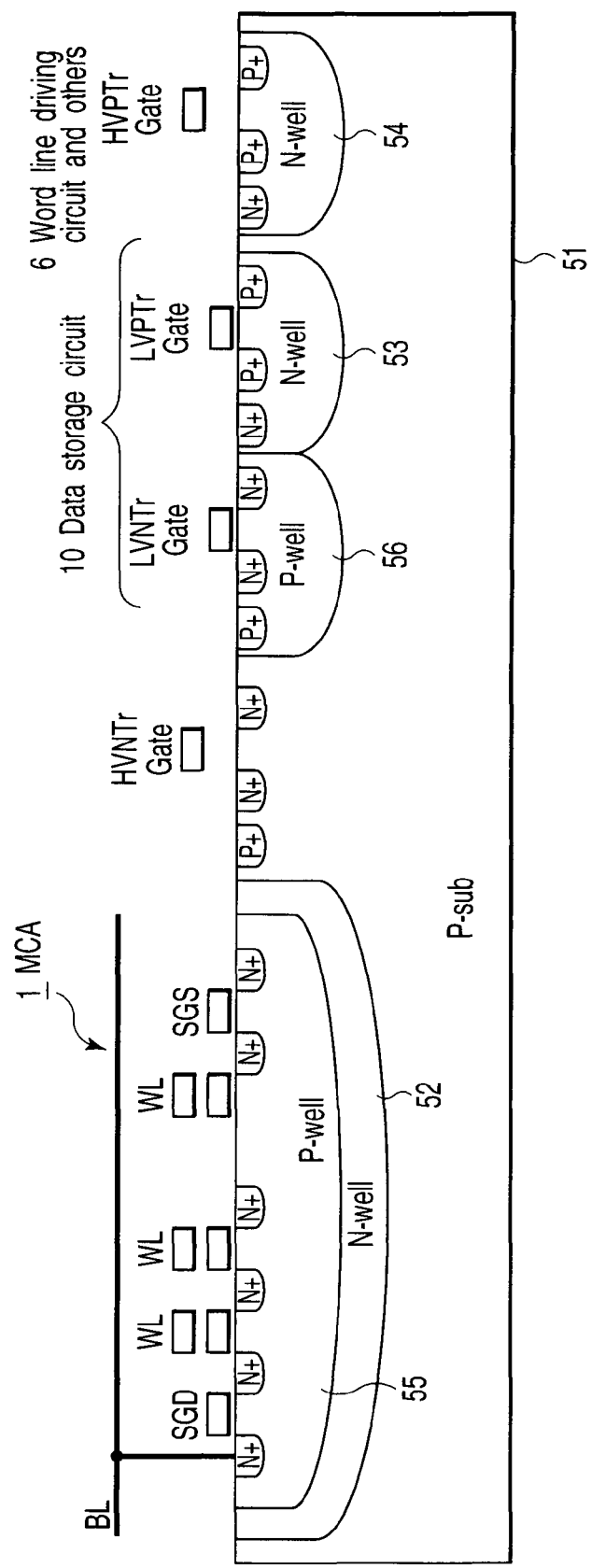
FIG. 6 is a sectional view of a semiconductor memory device according to the first embodiment.

FIG. 6 is a sectional view of a semiconductor memory device according to the first embodiment. For example, in a p-type semiconductor substrate 51, n-well regions 52, 53, 54 and a p-well region 56 are formed. In the n-well region 52, the p-well region 55 is formed. In the p-well region 55, low-voltage n-channel transistors LVNTr constituting the memory cell array 1 are formed. In the n-well region 53 and p-well region 56, a low-voltage p-channel transistor LVPTr and a low-voltage n-channel transistor LVNTr constituting a data storage circuit 10 are formed respectively. In the substrate 51, a high-voltage n-channel transistor HVNTr connecting a bit line and the data storage circuit 10 is formed. In the n-well region 54, a high-voltage p-channel transistor HVPTr constituting, for example, a word-line driving circuit or the like is formed. As shown in FIG. 6, the high-voltage transistors HVNTr, HVPTr have, for example, a thicker gate insulating film than that of the low-voltage transistors LVNTr, LVPTr.

FIG. 7 is a table listing examples of the voltages supplied to various regions in FIG. 6 in erasing, programming, and reading a memory cell.

FIG. 8 is a circuit diagram of an example of the data storage circuit 10 shown in FIG. 3.

The data storage circuit 10 includes a primary data cache (PDC), a secondary data cache (SDC), a dynamic data cache (DDC), a dynamic data cache Q (DDCQ), and a temporary data cache (TDC). The SDC, PDC, and DDC hold input data in a write operation, hold read data in a read operation, temporarily hold data in a verify operation, and are used to manipulate internal data in storing multilevel data. The TDC not only amplifies data on a bit line in reading data and temporarily holds the data, but also is used to manipulate internal data in storing multilevel data. The DDCQ stores data indicating whether a verify level a little lower than a specific verify level has been reached in a data write operation described later.

The SDC is composed of clocked inverter circuits 61a, 61b constituting a latch circuit and transistors 61c, 61d. The transistor 61c is connected between the input end of the clocked inverter circuit 61a and the input end of the clocked inverter circuit 61b. A signal EQ2 is supplied to the gate of the transistor 61c. The transistor 61d is connected between the output end of the clocked inverter circuit 61b and the ground. A signal PRST is supplied to the gate of the transistor 61d. Node N2a of the SDC is connected via a column select transistor 61e to an input/output data line IO. Node N2b of the SDC is connected via a column select transistor 61f to an input/output data line IOn. A column select signal CSLi is supplied to the gates of the transistors 61e, 61f. Node N2a of the SDC is connected to node N1a of the PDC via transistors 61g, 61h. A signal BLC2 is supplied to the gate of the transistor 61g. A signal BLC1 is supplied to the gate of the transistor 61h.

The PDC is composed of clocked inverter circuits 61i, 61j and a transistor 61k. The transistor 61k is connected between the input end of the clocked inverter circuit 61i and the input end of the clocked inverter circuit 61j. A signal EQ1 is supplied to the gate of the transistor 61k. Node N1b of the PDC is connected to the gate of the transistor 61l. One end of the current path of the transistor 61l is connected to the ground via a transistor 61m. A signal CHK1 is supplied to the gate of the transistor 61m. The other end of the current path of the transistor 61l is connected to one end of the current path of transistors 61n, 61o constituting a transfer gate. A signal CHK2n is supplied to the gate of the transistor 61n. The gate of the transistor 61o is connected to the output end of the clocked inverter circuit 61a. The other end of the current path of the transistors 61n, 61o is connected to a wiring line COMi. The wiring line COMi is connected equally to all of the data storage circuits 10. When the verification of all the data storage circuits 10 has been completed, the potential of the wiring line goes high. Specifically, as described later, if the verification has been completed, node N1b of the PDC goes low. In this state, when the signals CHK1, CHK2n are made high, if the verification has been completed, the wiring line COMi goes high.

Furthermore, the TDC is composed of, for example, a MOS capacitor 61p. The capacitor 61p is connected between a junction node N3 of the transistors 61g, 61h and the ground. The DDC is supplied via a transistor 61q to the junction node N3. A signal REG is supplied to the gate of the transistor 61q. Node N3 is connected to one end of the capacitor. A signal BOOST is supplied to the other end of the capacitor.

The DDC is composed of transistors 61r, 61s. A signal VPRE is supplied to one end of the current path of the transistor 61r. The other end of the transistor 614 is connected to the current path of the transistor 61q. The gate of the transistor 61r is connected to node N1a of the PDC via a transistor 61s. A signal DTG is supplied to the gate of the transistor 61s.

The DDCQ is composed of transistors 61Qr, 61Qs. A signal VPRE is supplied to one end of the current path of a transistor 61Qr. The other end of the current path of the transistor 61Qr is connected to a junction node N3 via the transistor 61Qq. A signal REGQ is supplied to the gate of the transistor 61Qq. The gate of the transistor 61Qr is connected to node N1a of the PDC via the transistor 61Qs. A signal DTGQ is supplied to the gate of the transistor 61Qs.

Furthermore, one end of the current path of each of transistors 61t, 61u is connected to the junction node N3. A signal VPRE is supplied to the other end of the current path of the transistor 61u. A signal BLPRE is supplied to the gate of the transistor 61u. A signal BLCLAMP is supplied to the gate of a transistor 61t. The other end of the current path of the transistor 61t is connected not only via a transistor 61v to one end of bit line BLo but also via a transistor 61w to one end of bit line BLe. The other end of bit line BLo is connected to one end of the current path of a transistor 61x. A signal BIASO is supplied to the gate of the transistor 61x. The other end of bit line BLe is connected to one end of the current path of a transistor 61y. A signal BIASe is supplied to the gate of the transistor 61y. A signal BLCRL is supplied to the other ends of the current paths of these transistors 61x, 61y. The transistors 61x, 61y are turned on according to signals BIASo, BIASe so as to be complementary to the transistors 61v, 61w, thereby supplying the potential of the signal BLCRL to the unselected bit lines.

The above-described signals and voltages are generated by the control signal and control voltage generator circuit 7 of FIG. 3. The operations below are controlled by the control signal and control voltage generator circuit 7.

The data storage circuit 10 of FIG. 4 has the same configuration as that of FIG. 8, except for the connection with the bit lines. Specifically, as shown in FIG. 8, for example, only the transistor 61v is connected to the other end of the transistor 61t, which is connected to bit line BLe or BLo via the transistor 61v.

The memory, which is a multilevel memory, can store 2 bits of data in a cell. Switching between 2 bits is done using an address (first page, second page). When 2 bits are stored in a single cell, there are two pages. When 3 bits are stored in a single cell, switching between 3 bits is done using an address (first page, second page, third page). When 4 bits are stored in a single cell, switching is done using an address (first page, second page, third page, fourth page).

Figure 9:
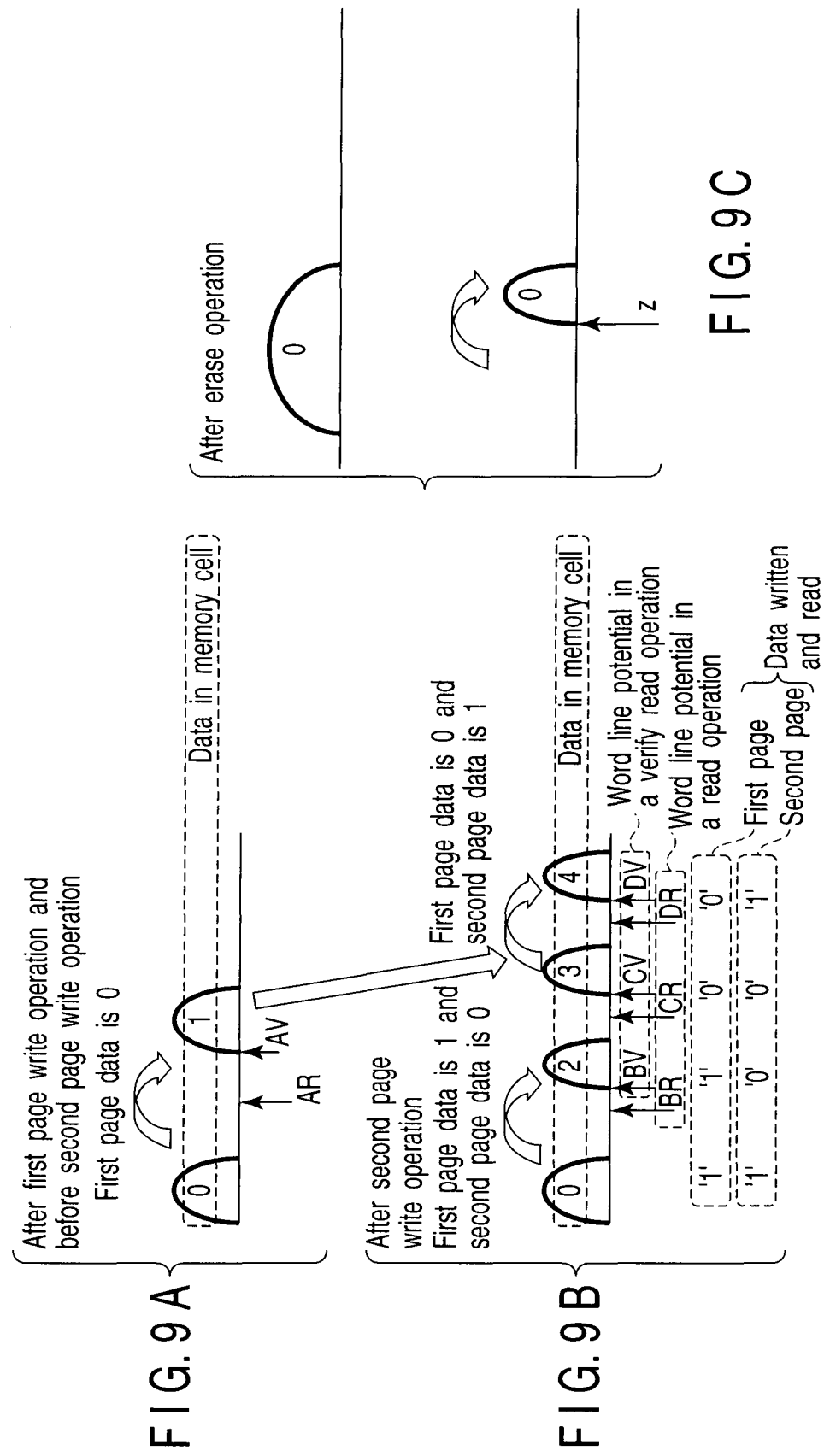
FIGS. 9A, 9B, and 9C show the relationship between data and threshold voltages when 2 bits of data are stored in a memory cell.

FIGS. 9A, 9B, and 9C show the relationship between data and the threshold voltage when 2 bits of data are stored in a memory cell. When an erase operation has been carried out, the data in the memory cell is "0" as shown in FIG. 9C. After the erase operation, writing is done using, for example, verify level "z" to narrow the expansion of the threshold voltage distribution. The data "0" is set in, for example, a negative threshold voltage distribution.

As shown in FIG. 9A, in a first page write operation, if write data is "1", the data in the memory cell remains at "0". If write data is "0", the data in the memory cell is "1".

As shown in FIG. 9B, after the second page has been written to, the data in the memory cell is any one of "0", "2", "3", and "4" according to the write data. Specifically, if the data in the memory cell after the first page write operation is "0" and the write data for the second page is "1", the data in the memory cell remains at "0". If the write data is "0", the data in the memory cell is "2". In addition, if the data in the memory cell after the first page write operation is "1" and the write data is "0", the data in the memory cell is "3". If the write data is "1", the data in the memory cell is "4". In the embodiment, the data in the memory cell is defined in ascending order of threshold voltage. Data "1", "2", "3", and "4" are, for example, positive threshold voltages.

Figure 10:
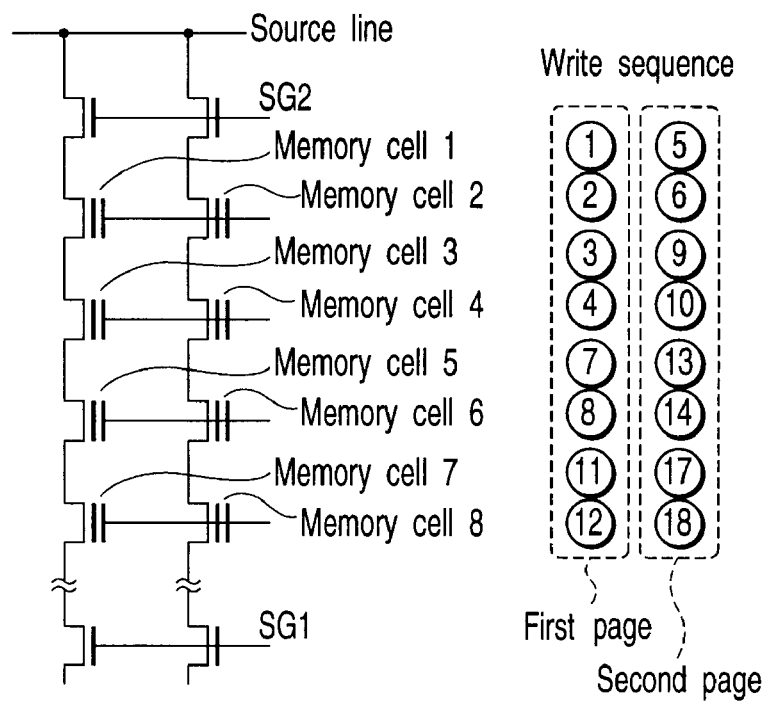
FIG. 10 shows a write sequence in two NAND units.

FIG. 10 shows the order in which two NAND units are written to. In a block, the memory cells closer to the source line are written to earlier in pages. For example, first, the data on the first page is written to the memory cells 1 and 2. Then, the data on the first page is written to the memory cells 3 and 4. Next, the data on the second page is written to the memory cells 1 and 2 and then the data on the first page is written to the memory cells 5 and 6. From this point on, writing is done as shown in FIG. 10.

(Read Operation)

As shown in FIG. 9B, after the second page has been written to, the data in the memory cell is set to the threshold voltage distribution of any one of data "0", "2", "3", and "4". For this reason, the reading of the second page is done by setting read levels "BR", "CR", and "DR" between them.

A read operation will be explained concretely.

First, the control signal and control voltage generator circuit 7 generates a voltage Vfix (e.g., 1.6 V) and applies the voltage to the well of the selected cell, the source line, the unselected bit lines, and the select gates of the unselected blocks. If the threshold voltage distribution of data "0" is set on the positive voltage side, not on the negative voltage side, Vfix is set at 0 V.

A read potential Vfix+AR, BR, CR, or DR is applied to the selected word line. For example, if AR=−0.5 V, Vfix+AR is 1.1 V. At the same time, Vread+Vfix is applied to the unselected word lines of the selected block, Vsg (Vdd+Vth)+Vfix (Vth: threshold voltage of an n-channel MOS transistor) is applied to the select gate SGD of the selected block, and Vfix is applied to SGS. Vfix is also applied to the source line (SRC) and the well of the cell.

Next, signal VPRE of the data storage circuit 10 shown in FIG. 8 is set at Vdd (e.g., 2.5 V), signal BLPRE is set at Vsg (Vdd+Vth), signal BLCLAMP is set at, for example, (0.6 V+Vth)+Vfix, which are applied temporarily. Thereafter, the bit line is precharged to, for example, 0.6 V+Vifx=2.2 V. Next, the select line SGS on the source side of the cell is set at Vsg (Vdd+Vth)+Vfix. Since the well and the source are at Vfix, when the threshold voltage of the cell is higher than AR, BR, CR, or DR (e.g., AR=−0.5 V), the cell turns off. For this reason, the bit line remains at the high level (e.g., 2.2 V). If the threshold voltage of the cell is lower than AR, BR, CR, or DR, the cell turns on. Consequently, the bit line is discharged and has the same potential as that of the source, that is, is at Vfix (e.g., 1.6 V).

Thereafter, signal BLPRE of the data storage circuit 10 shown in FIG. 8 is set temporarily at Vsg (Vdd+Vth). After the node of the TDC has been precharged to Vdd, signal BOOST is raised from the low level to the high level, thereby setting TDC at αVDD (or TDC=αVdd, for example, α=1.7 and αVdd=4.25 V). Here, a voltage of, for example, (0.45 V+Vth)+Vfix is applied to signal BLCLAMP. If the bit line is lower than 0.45 V+Vfix, the node of TDC is at the low level (Vfix (e.g., 1.6 V)). If the bit line is higher than 0.45 V, the node of TDC remains at the high level (αVdd (e.g., 4.25 V). After signal BLCLAMP is set at Vtr (e.g., 0.1 V+Vth) (or BLCLAMP=Vtr), the signal BOOST is lowered from the high level to the low level. Here, when TDC is at the low level, it drops from Vfix (e.g., 1.6 V). Since BLCLAMP=Vtr (e.g., 0.1 V+Vth), the TDC does not drop below 0.1 V. When the TDC is at the high level, it drops from αVdd (e.g., 4.25 V) to Vdd. Here, signal BLC1 is set at Vsg (VDdd+Vth) (or BLC1=Vsg (Vdd+Vth)), the potential of the TDC is read into the PDC. If the threshold voltage of the cell is lower than AR, BR, CR, or DR, the PDC is at the low level. If the threshold voltage is higher than AR, BR, CR, or DR, the PDC is at the high level. Then, reading is done.

(Program)

Figure 11:
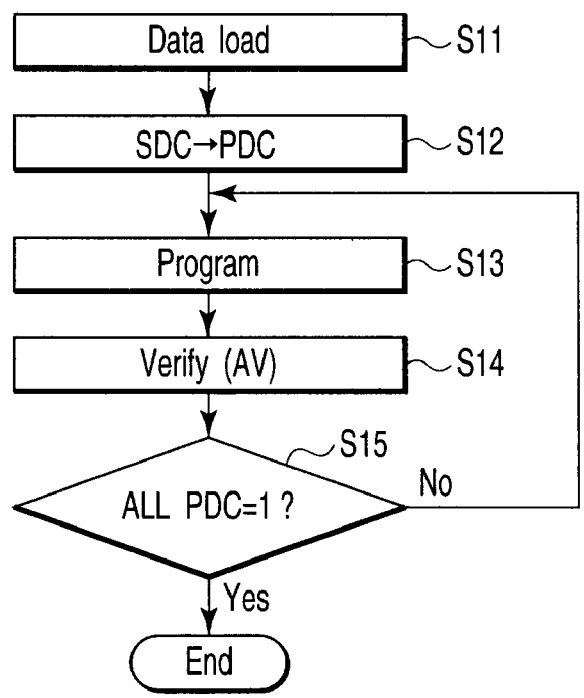
FIG. 11 is a flowchart to explain a first-page program operation.
Figure 12:
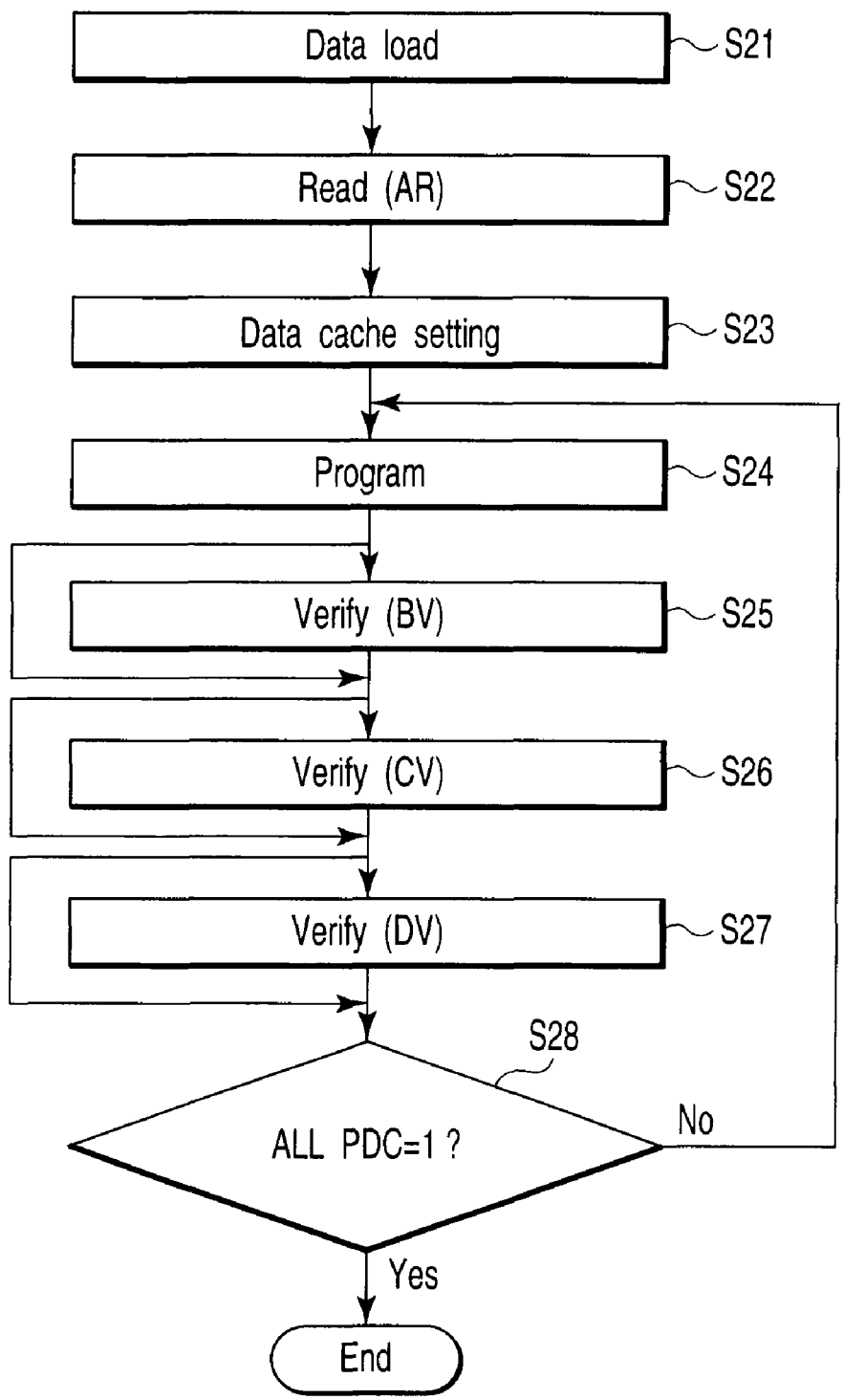
FIG. 12 is a flowchart to explain a second-page program operation.

FIG. 11 is a flowchart to explain a program operation of the first page. FIG. 12 is a flowchart to explain a program operation of the second page.

In a program operation, first, an address is specified, thereby selecting two pages shown in FIGS. 3 and 4. In the memory, the two pages can be programmed only in this order: the first page and the second page. Therefore, first, the first page is selected using an address.

In a program operation of the first page shown in FIG. 11, when write data is input from the host 11, these data items are stored in the SDCs (shown in FIG. 8) of all the data storage circuits 10 (S11). When a write command is input from the host 11, the data in the SDCs of all the data storage circuits 10 are transferred to the PDC (S12). When data "1" (no writing is done) is input from the host 11, node N11a of the PDC goes to the high level. When data "0" (writing is done) is input, node N1a of the PDC goes to the low level. Hereinafter, the data in the PDC is the potential at node N1a and the data in the SDC is the potential at node N2a.

(Program Operation) (S13)

When signal BLC1 of FIG. 8 is set at Vdd+Vth, if data "1" (no writing is done) has been stored in the PDC, the bit line is at Vdd. If data "0" (writing is done) has been stored, the bit line is at Vss. In the case of the configuration shown in FIG. 3, the cells which are connected to the selected word line and are on the unselected pages (where the bit lines are unselected) must not be written to. For this reason, the bit lines connected to the cells are also set at Vdd as are the cells in which data "1" has been input.

Here, when the select line SG1 of the selected block is set at Vdd, Vpgm (20 V) is applied to the selected word line, and Vpass (10 V) is applied to the unselected word lines, if the bit line is at Vss, the channel of the cell is at Vss and the word line is at Vpgm, which causes writing to be done. If the bit line is at Vdd, the channel of the cell is not at Vss, but at about Vpgm/2 by coupling, which prevents programming from being done.

After the first page has been written to, the data in the memory cell are data "0" and data "1".

(Program Verify Read Operation) (S14)

In a program operation, the memory cell is written to from a lower level of threshold voltage. For this reason, on the first page, a program verify operation is carried out at an AV level. A program verify operation is almost the same as the aforementioned read operation.

First, the control signal and control voltage generator circuit 7 generates a voltage Vfix (e.g., 1.6 V) and applies Vfix to the well of the selected cell, the source line, the unselected bit lines, and the select gates of the unselected blocks. In this state, a potential Vfix+AV (e.g., if AR=−0.4 V, Vfix+AV is 1.2 V) a little higher than the potential Vfix+AR in a read operation is applied to the selected word line. The potential Vfix+AV (e.g., 1.2 V) in a verify read operation is applied to the selected word line, which enables a negative potential to be apparently applied to the gate of the cell. At the same time, Vread+Vfix is applied to the unselected word lines of the selected block, Vsg (Vdd+Vth)+Vfix is applied to the select gate SGD of the selected block, and Vfix is applied to the SGS. Vfix is applied to the source line SRC. Vfix is also applied to the well of the cell.

Next, signal VPRE of the data storage circuit 10 shown in FIG. 8 is set at Vdd (e.g., 2.5 V). Signal BLPRE is set temporarily at Vsg (Vdd+Vth). Signal BLCLAMP is set temporarily at, for example, (0.6 V+Vth)+Vfix. The bit line is precharged to, for example, 0.6 V+Vfix=2.2 V.

Next, the select line SGS on the source side of the cell is set at Vsg (Vdd+Vth)+Vfix. Since the well and the source are at Vfix, a cell whose threshold voltage is higher than AV (e.g., AV=−0.4 V) turns off. As a result, the bit line remains at the high level (e.g., 2.2 V). A cell whose threshold voltage is lower than AV turns on. As a result, the bit line is discharged to the same potential as that of the source, that is, Vfix (e.g., 1.6 V). While the bit line is being discharged, signal DTG is set temporarily at Vsg (Vdd+Vth), thereby copying the PDC to the DDC.

Next, signal BLPRE of the data storage circuit 10 is set temporarily at Vsg (Vdd+Vth), thereby precharging the node of the TDC to Vdd. Thereafter, signal BOOST is raised from the low level to the high level, thereby setting the TDC at αVdd (e.g., α=1.7, αVdd=4.25 V). Here, the potential of signal BLCLAMP is set at, for example, (0.45 V+Vth)+Vfix. When the bit line is lower than 0.45+Vfix, the node of the TDC is at the low level (Vfix (e.g., 1.6 V)). When the bit line is higher than 0.45 V, the node of the TDC remains at the high level (αVdd (e.g., 4.25 V)). After signal BLCLAMP is set at Vtr (e.g., 0.1 V+Vth), signal BOOST is lowered from the high level to the low level. Here, when signal BOOST is at the low level, the TDC drops from Vfix (e.g., 1.6 V). However, since signal BLCLAMP is set at Vtr (e.g., 0.1 V+Vth), the TDC does not drop below 0.1 V. Moreover, when signal BOOST is at the high level, the node of the TDC changes from (αVdd (e.g., 4.25 V)) to Vdd. Here, signal BLC1 is set at Vsg (Vdd+Vth), thereby reading the potential of the TDC into the PDC.

Next, signal VPRE is set at Vdd and signal REG is set at Vsg (Vdd+Vth). When the DDC is at the high level (no writing is done), the TDC is forced to be at the high level. However, when the DDC is at the low level (writing is done), the value in the TDC remains unchanged. Here, signal BLC1 is set at Vsg (Vdd+Vth), thereby reading the potential in the TDC into the PDC. Accordingly, when the PDC is at the low level (writing is done), if the threshold voltage of the cell is lower than the level AV, the PDC goes to the low level again (writing is done). If the threshold voltage of the cell is higher than the level AV, the PDC goes to the high level, which prevents writing from being done in the next and later program loops.

Furthermore, if the PDC has been at the higher level (no writing is done), the PDC is at the high level, preventing the next writing from being done in the next program loop. This operation is repeated until the PDCs of all the data storage circuits 10 have gone to the high level (S15 to S13).

(Second Page Program)
(Second Page Write Operation)

In a second-page write operation shown in FIG. 12, first, write data is externally input and stored in the SDCs of all the data storage circuits 10 (S21). Thereafter, in a first-page write operation, to check the written data, a read level AR (e.g., a negative voltage) is set on the word line, thereby reading the data from the memory cells (S22). The read operation is as described above. If the threshold voltage of the cell is lower than the potential AR of the word line, the PDC is at the low level. If the threshold voltage of the cell is higher than the potential AR, the PDC is at the high level.

Thereafter, the data cache is set (S23). Specifically, the second page is written to as shown in FIG. 9B.

When data is "1" in the first page write operation and data is "1" in the second page write operation, the second page is not written to.

When data is "1" in the first page write operation and data is "0" in the second page write operation, the data in the memory cell is set at "2" in the second page write operation.

When data is "0" in the first page write operation and data is "0" in the second page write operation, the data in the memory cell is set at "3" in the second page write operation.

When data is "0" in the first page write operation and data is "1" in the second page write operation, the data in the memory cell is set at "4" in the second page write operation.

To carry out the above operation, the data cache is set.

Specifically, to set the data in the memory cell at "0" (data "1" on first page and data "1" on second page), the PDC is set at the high level, the DDC is set at the low level, and the SDC is set at the high level.

To set the data in the memory cell at "2" (data "1" on first page and data "0" on second page), the PDC is set at the low level, the DDC is set at the high level, and the SDC is set at the high level.

To set the data in the memory cell at "3" (data "0" on first page and data "0" on second page), the PDC is set at the low level, the DDC is set at the high level, and the SDC is set at the low level.

To set the data in the memory cell at "4" (data "0" on first page and data "1" on second page), the PDC is set at the low level, the DDC is set at the low level, and the SDC is set at the low level.

The data in each of the PDC, DDC, and SDC is set by supplying the signals BLC1, BLC2, DTG, REG, and VPRE in a specific sequence and transferring the data in the PDC, DDC, SDC, and TDC. Explanation of concrete operations will be omitted.

(Program Operation) (S24)

A program operation is exactly the same as the first page program operation. When data "1" has been stored in the PDC, no writing is done. When data "0" is stored, writing is done.

(Verify Operation) (S25, S26, S27)

A program verify read operation is the same as a read operation. Verify levels BV, CV, and DV are set to levels higher than the read levels by adding a margin to the read levels. Using the verify levels BV, CV, and DV, a verify read operation is carried out.

A verify operation is carried out at, for example, the verify levels BV, CV, and DV in that order.

Specifically, first, the verify level BV is set on the word line, thereby verifying whether the threshold voltage of the memory cell has reached the verify level BV (S25). If the result of the verification has shown that the threshold voltage of the memory cell has reached the verify level, the PDC goes to the high level, which prevents writing from being done. If the result of the verification has shown that the threshold voltage of the memory cell has not reached the verify level, the PDC goes to the low level, which allows writing to be done in the next program.

Thereafter, the verify level CV is set on the word line, thereby verifying whether the threshold voltage of the memory cell has reached the verify level CV (S26). If the result of the verification has shown that the threshold voltage of the memory cell has reached the verify level, the PDC goes to the high level, which prevents writing from being done. If the result of the verification has shown that the threshold voltage of the memory cell has not reached the verify level, the PDC goes to the low level, which allows writing to be done in the next program.

Then, the verify level DV is set on the word line, thereby verifying whether the threshold voltage of the memory cell has reached the verify level DV (S27). If the result of the verification has shown that the threshold voltage of the memory cell has reached the verify level, the PDC goes to the high level, which prevents writing from being done. If the result of the verification has shown that the threshold voltage of the memory cell has not reached the verify level, the PDC goes to the low level, which allows writing to be done in the next program.

When the second page is written to, if the above operation is performed in the program verify operation at level BV, the cells to be written to at level CV and level DV are not written to in the program verify operation at level BV. For this reason, for example, when writing is done at level CV and level DV, node N2a shown in FIG. 8 is set at the low level. When writing is done at level BV, node N2a is set at the high level. In this state, signal REG is set at Vsg (REG=Vsg). If no writing is done, signal BLC2 is set at Vtr (0.1 V+Vth) before the operation of forcing the TDC to be at the high level. If writing is done at level CV and level DV, the TDC is forced to be at the low level. This prevents writing from being completed in a program verify operation at level BV.

Furthermore, when the second page is written to, if the above operation is performed in a program verify operation at level CV, the cell to be written to at level DV is not written to in a program verify operation at level CV. For this reason, for example, when writing is done at level CV, node N1a shown in FIG. 8 is set at the low level. In a case other than this, node N1a is set at the high level. In this state, signal REG is set at Vsg. Moreover, when no writing is done, signal BLC1 is set at Vtr (0.1 V+Vth) before the TDC is forced to be at the high level. When writing is done at level DV, the TDC is forced to be at the high level, which prevents writing from being completed in a program verify operation at level DV. When the PDC is at the low level, a write operation is carried out again. The program operation and verify operation are repeated until the PDCs of all the data storage circuits 10 have gone to the high level (S28-S24)

(Erase Operation)

An erase operation is carried out in blocks shown in FIGS. 3 and 4. After the erase operation, the threshold voltage of the cell is data "0" in the memory cell as shown in FIG. 9C. After erasing, the threshold voltage distribution in the cell has become wider. For this reason, in the erased area self-boost (EASB) writing method, the threshold voltage of the cell is made shallower after erasing. First, the EASB writing method will be explained. In the writing method, writing never fails to be done from the source side.

FIG. 13 shows the EASB writing method. As shown in FIG. 13, first, when writing is done, the bit line set at Vss. When no writing is done, the bit line is set at Vdd. Next, for example, when the cell on word line WL7 is written to, word lines WL0 to WL4 are set at Vpass, word line VL5 is set at Vss, word line VL6 is set at Vdd, word line WL7 is set at Vpgm, and word lines WL8 to WL31 are set at Vpass. At this time, when writing is done, the gate of word line WL7 is at Vpgm and the channel is at Vss, with the result that writing is done. When no writing is done, the channel is at, for example, Vpass/2. If the number of cells written to is large, the channel becomes more difficult to boost. However, in the EASB writing method, writing never fails to be done from the source side. Accordingly, if word line WL5 is set at Vss and boosting is done, the channel is boosted, which prevents writing from being done, since the cells on word lines WL8 to WL31 have been erased from. As described above, the charge boosted to the cell already written to has to be prevented from moving. With the cells connected to word line WL5 in the erased state, if the threshold voltage is much lower, the cells cannot turn off. Therefore, the erased cells have to be made less low.

Accordingly, after the erase operation, all the word lines in the block are selected and a program and a program verify read operation are carried out, thereby performing a write operation up to level "z" as shown in FIG. 9C. At this time, in the program operation and the program verify read operation, all the word lines are selected, the potential of the selected word line in a verify operation is set at z+Vfix (e.g., 0 V), and the other potentials are set in exactly the same manner as in a normal program and a program verify read operation.

First Embodiment

FIGS. 1, 14A, and 14B are related to a first embodiment of the invention. They show, for example, a read sequence of the first page after the second page write operation. In reading the first page after the second page write operation, a potential CR is supplied to the selected word line as a read level as shown in FIG. 9B. Referring to FIGS. 1, 14A, and 14B, a read operation of the first page will be explained.

As shown in FIG. 14A, the first embodiment relates to a case where a read level (CR) lies in the threshold voltage distribution of a cell to be read from. In this case, first, a read level (CR) is set as shown in FIG. 14A. Using the read level (CR), data is read from the memory cells (2 to 4 KB) of the first page (S31). Thereafter, using a read level (CR−x) obtained by subtracting a specific level (x) from the read level (CR), the data on the first page is read (S32). For example, the host 11 counts the number of cells existing between the two levels, (CR) and (CR−x) (S33). For example, the data storage circuit 10 XORs the data read using the two levels, (CR) and (CR−x), and supplies the result to the host 11. The host 11 counts the number of data "1" in the supplied data, finding the number of cells existing between the two levels. Then, the host 11 determines whether the count is equal to or less than a specified value (S34). If the result of the determination has shown that the number of cells is less than the specified value, the host determines that the data read at the level (CR) is the read result (S35).

If the count is equal to or larger than the specified value, the read level is lowered and the read operation is carried out again (S36, S31, S32). For example, when the read level CR is decreased by x, the host counts the number of cells existing between the read levels (CR−x) and (CR−2x) and determines whether the count is equal to or less than the specified value (S33, S34). If the result of the determination has shown that the number of cells is less than the specified value, the host determines that the data read at the level is the read result (S35).

At this time, if a decrement in the read level is the same value as (x) used in the preceding read operation, the read level CR in step S31 is the data read at the read level (CR−x) in step S32, which has been already read. For this reason, there is no need to do reading at the read level (CR−x). Thus, step S31 may be omitted, reducing the number of times reading is done.

Figure 15:
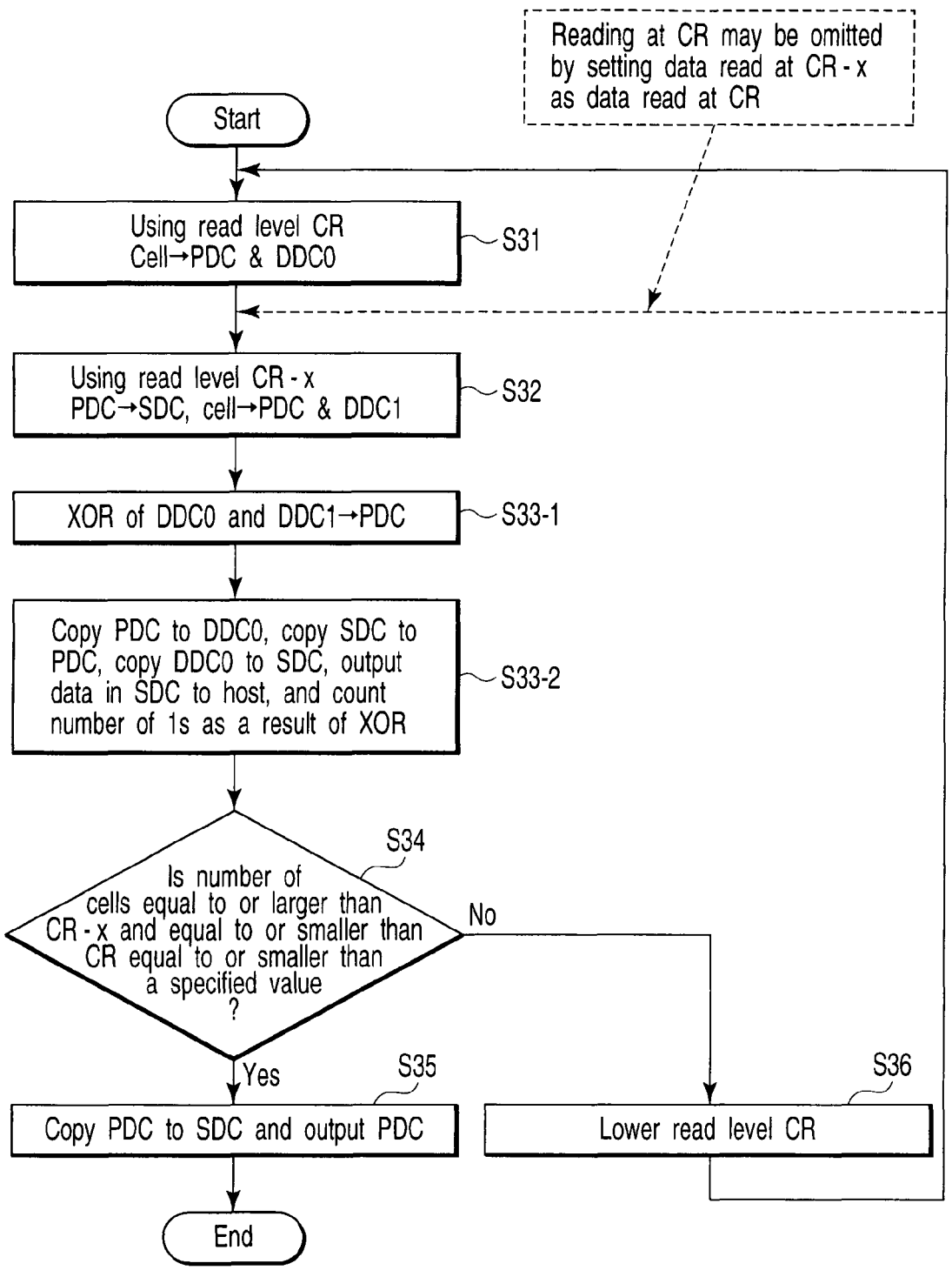
FIG. 15 is a flowchart to explain a concrete operation of the data storage circuit in a read operation in the first embodiment.

FIG. 15 is a flowchart to explain a concrete operation of the data storage circuit 10 in the read operation. In FIG. 15, the same parts as those in FIG. 1 are indicated by the same reference numbers.

First, the read level (CR) is applied to the selected word line, thereby reading the data in the memory cell. The read data is latched in the PDC and then copied to DDC0 (S31). Thereafter, the data in the PDC is copied to the SDC. Then, the read level (CR−x) is applied to the selected word line, thereby reading the data in the memory cell. The read data is latched in the PDC and then copied to DDC1 (S32).

Next, the data in DDC0 is XORed with the data in DDC1 (S33-1). Specifically, signal VPRE is set at Vss, signal BLPRE is set at Vdd, and the TDC is set at Vss. Thereafter, signal VPRE is set at Vdd and signal REG0 is set at the high level, thereby copying the data in DDC0 to the TDC. Then, signal VPRE is set at Vss and signal REG1 is set at the high level. If the data in DDC1 is "1", the TDC is forced to be at Vss. Thereafter, the data in the TDC is transferred to the PDC. As a result, the data in DDC0, DDC1, and PDC are as follows:

DDC0: 1 1 0 0
DDC1: 1 0 1 0
PDC: 0 1 0 0

Next, signal VPRE is set at Vss, signal BLPRE is set at Vdd, and the TDC is set at Vss. Thereafter, signal VPRE is set at Vdd, signal REG1 is set at the high level, and the data in DDC1 is copied to the TDC. Furthermore, signal VPRE is set at Vss and signal REG0 is set at the high level. If the data in DDC1 is "1", the TDC is forced to be at Vss. As a result, the data in DDC0, DDC1, PDC, and TDC are as follows:

DDC0: 1 1 0 0
DDC1: 1 0 1 0
PDC: 0 1 0 0
TDC: 0 0 1 0

Then, signal DTG0 is temporarily made high. After the data in the PDC is transferred to DDC0, signal VPRE is set at Vdd and signal REG0 is set at the high level. If DDC0 has "1", the TDC is forced to be at Vdd. Thereafter, the data in the TDC is transferred to the PDC. As a result, the data obtained by XORing the data in DDC0 with the data in DDC1 is latched in the PDC as follows:

DDC0: 0 1 0 0
DDC1: 1 0 1 0
PDC: 0 1 1 0

Thereafter, the host 11 counts the number of data "1" from the result of XOR (S32-2). Specifically, signal DTG0 is made high, thereby copying the data in the PDC to DDC0, the data in the SDC into the PDC, and the data in DDC0 into the SDC. The data in the SDC is output to the host 11. The host 11 counts the number of data "1" supplied from the individual data storage circuits.

Next, the host determines whether the count is equal to or less than the specified value (S34). If the result of the determination has shown that the count is equal to or less than the specified value, the data read at the read level (CR) has been latched in the PDC. Thus, the data in the PDC is copied to the SDC, which outputs the data to the host 11 (S35).

Furthermore, in step S34, if the count is equal to or larger than the specified value, the read level is lowered (S36) and the read operation is carried out again. Here, when the data previously read at the read level (CR−x) is used, the data read at the read level (CR−x) is in DDC1. Thus, the data in DDC1 is copied to the PDC and the data read at (CR−x) is determined to be the data read at (CR). In this case, as shown in a broken line of FIG. 15, step S31 may be omitted.

With the first embodiment, data is read, changing the read levels (CR) and (CR−x), and the number of cells between the two read levels is counted. If the count is equal to or less than a specified value, the data read at the read level (CR) is output as regular read data. For this reason, even if the margin between adjacent threshold voltage distributions gets narrower as a result of, for example, temporal change, the data in each threshold value distribution can be read accurately.

In the first embodiment, reading has been done at the read level (CR−x) obtained by subtracting a specific level (x) from the read level (CR). The invention is not limited to this. For instance, it is possible to do reading at a read level (CR+x) obtained by adding (x) to the read level (CR), count the number of cells existing between the read levels (CR) and (CR+x), and compare the count with a reference value.

Furthermore, while in the first embodiment, the number of cells has been counted and the count has been compared with the reference value at the host 11, the invention is not limited to this. For instance, the count and comparison may be made at the control signal and control voltage generator circuit 7.

Second Embodiment

Figure 16A:
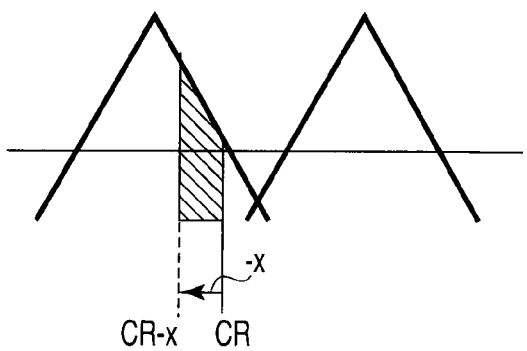
FIGS. 16A and 16B are diagrams to explain a first page read sequence in a memory cell according to a second embodiment of the invention.
Figure 16B:
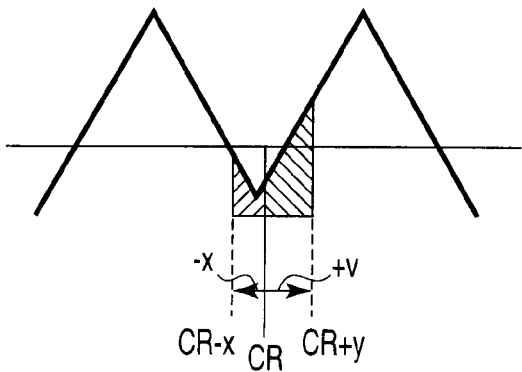
Figure 17:
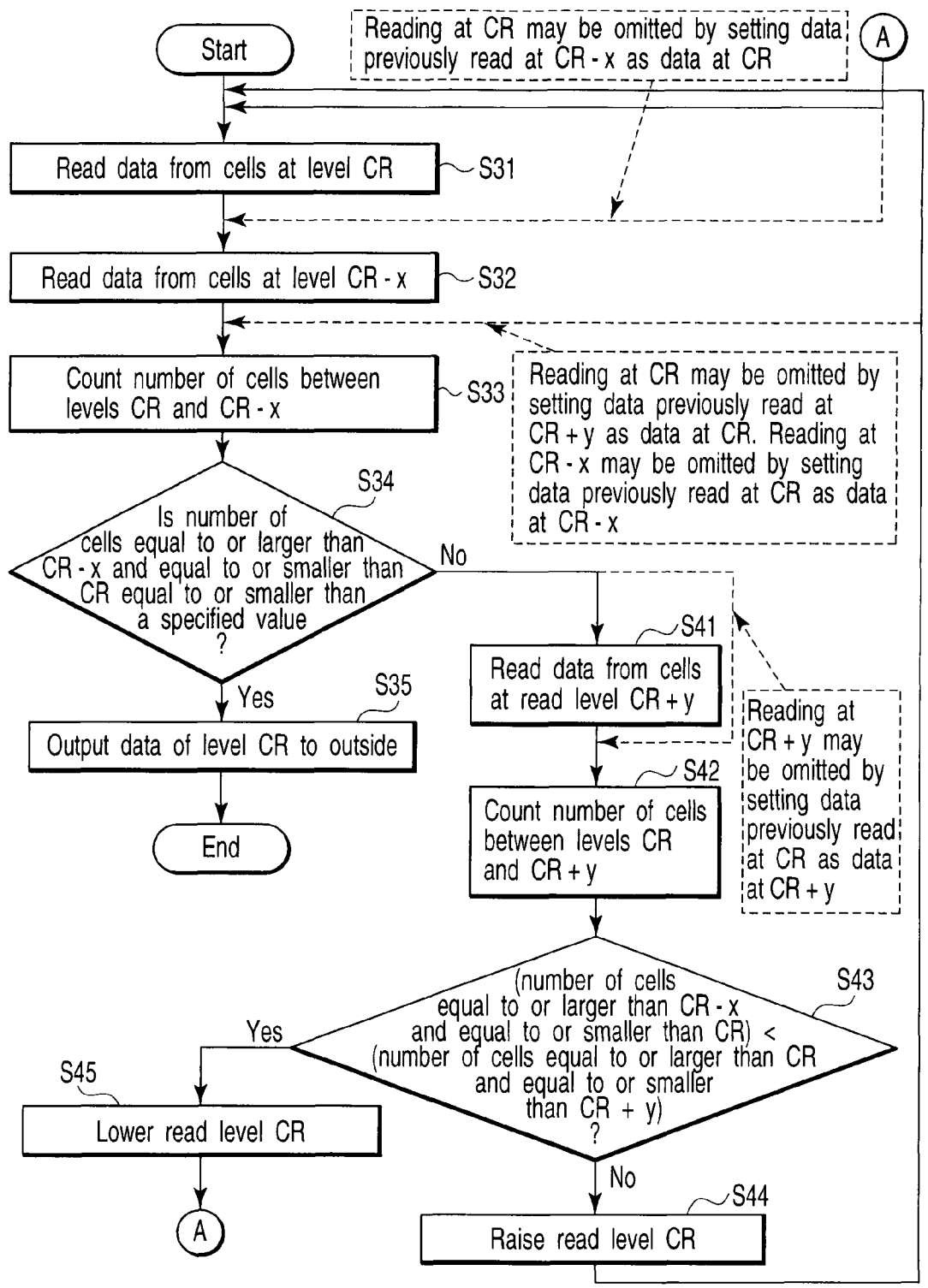
FIG. 17 is a flowchart to explain a first page sequence in a memory cell in the second embodiment.

FIGS. 16A, 16B, and 17 are related to a second embodiment of the invention. They show a read sequence of the first page of a memory cell. In FIG. 17, the same parts as those in FIG. 1 are indicated by the same reference numbers.

As shown in FIG. 16A, when the read level (CR) lies in a threshold voltage distribution lower than the threshold voltage distribution of a memory cell to be read from, lowering the read level (CR) by a specific level (x) results in an increase in the specified value. In this case, the read level is raised and reading is done again in the second embodiment.

Specifically, as shown in FIGS. 16B and 17, first, the data is read from the memory cells of the first page (2 to 4 KB) using the read levels (CR) and (CR−x) in the same manner as in the first embodiment (S31, S32). The number of cells existing between the read levels (CR) and (CR−x) is counted (S33). It is determined whether the count is equal to or less than a specified value (S34). If the result of the determination has shown that the count is equal to or less than the specified value, the data read at the read level (CR) is output as regular data.

If the result of the determination has shown that the count is equal to or larger than the specified value, reading is done at a read level (CR+y) obtained by adding a specific level (y) to the read level (CR) (S41) and the number of cells existing between the already read level (CR) and the read level (CR+y) is counted (S42). Thereafter, it is determined whether (number of cells equal to or larger than (CR−x) and equal to or smaller than (CR))<(number of cells equal to or larger than (CR) and equal to or smaller than (CR+y)) (S43). If the result of the determination has shown that the condition is fulfilled, the read level is lowered (S45) and the read operation is carried out again (S31).

At this time, when it is assumed that the specific levels (x) and (y) have the same potential difference, setting the data read previously at the read level (CR−x) as the data read at (CR) enables the read operation at the read level (CR) (step S31) to be omitted as shown in the broken line in FIG. 17. Moreover, setting the data read previously at the read level (CR) as the data read at (CR+y) enables the read operation at the read level (CR+y) (step S41) to be omitted as shown in the broken line.

Furthermore, in step S43, if the condition is not fulfilled, that is, if (number of cells equal to or larger than (CR−x) and equal to or smaller than (CR))>(number of cells equal to or larger than (CR) and equal to or smaller than (CR+y)), the read level is raised by, for example, a specific level (y) and the read operation is carried out again (S44 to S31).

At this time, setting the data read previously at the read level (CR+y) as the data read at (CR) enables the read operation at the read level (CR) (step S31) to be omitted. Setting the data read previously at the read level (CR) as the data read at (CR−x) enables the read operation at the read level (CR−x) (step S32) to be omitted. Accordingly, in this case, as shown by the broken line in FIG. 17, control is passed from step S44 to step S33. Moreover, in this case, in step S44, since (+y) is added to the read level (CR), step S41 can be omitted as shown by the broken line.

When the above operations are repeated and the condition in step S34 is satisfied, regular data is read.

When the above operations are repeated, the result may not converge. In this case, a maximum value is set for the repeat count. When the repeat count has reached the maximum value, the operation is terminated.

Alternatively, each time the operation is repeated, the values of the specific levels (x) and (y) may be made smaller.

With the second embodiment, the read level can be set to the optimum value between adjacent threshold voltage distributions by raising and lowering the read level. Accordingly, even when the margin between adjacent threshold voltage distributions is small, data can be read reliably.

Third Embodiment

FIGS. 18A, 18B, 18C, and 19 show a read sequence of the first page in a third embodiment of the invention. The third embodiment is a modification of the first embodiment.

Although 2 to 4 KB of cells are written to simultaneously in a NAND flash memory, the data written in each level differs in percentage. For example, when 4 bits of data are stored in a cell using 16 levels, a writing unit is 4 KB=32 Kilobits, and data exists evenly in each level (threshold voltage distribution), it follows that 32 Kilobits/16=2 Kilobits. However, depending on write data, the result may be equal to or less than 10 bits or 0 bits.

Figure 18A:
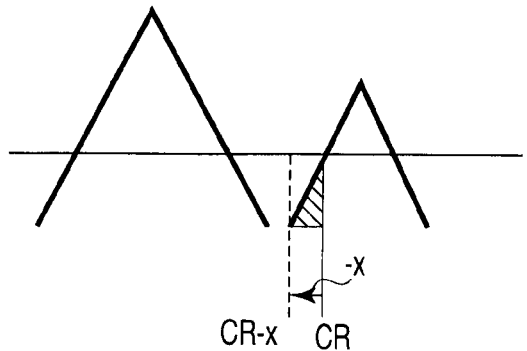
FIGS. 18A, 18B, and 18C are diagrams to explain a first page read sequence according to a third embodiment of the invention.

In this case, as shown in FIG. 18A, when reading is done at the read levels (CR) and (CR−x) using the first embodiment and the number of cells existing between these read levels is counted, the count is equal to or less than the specified value. Therefore, repetitive reading is not done.

Figure 18B:
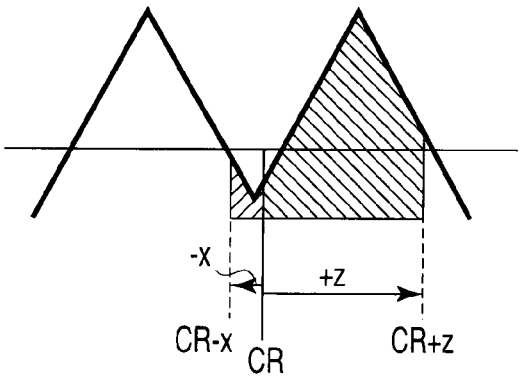
Figure 18C:
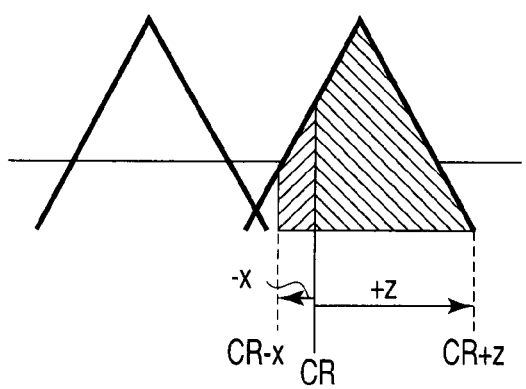

In the third embodiment, as shown in FIGS. 18B and 18C, to make a more accurate determination, the data is read from a cell using the read levels (CR) and (CR−x) and (CR+z) obtained by adding a specific level (z) to the read level (CR). Then, the ratio of the number of cells existing between CR and (CR−x) to that between CR and (CR+z) is compared with a specified value. The specific level (z) is set so as to be larger than, for example, (x) and (y) and the number of cells existing between the read levels (CR) and (CR+z) is so set that the greater part of the cells existing in the threshold voltage distribution are included in the number of cells.

Figure 19:
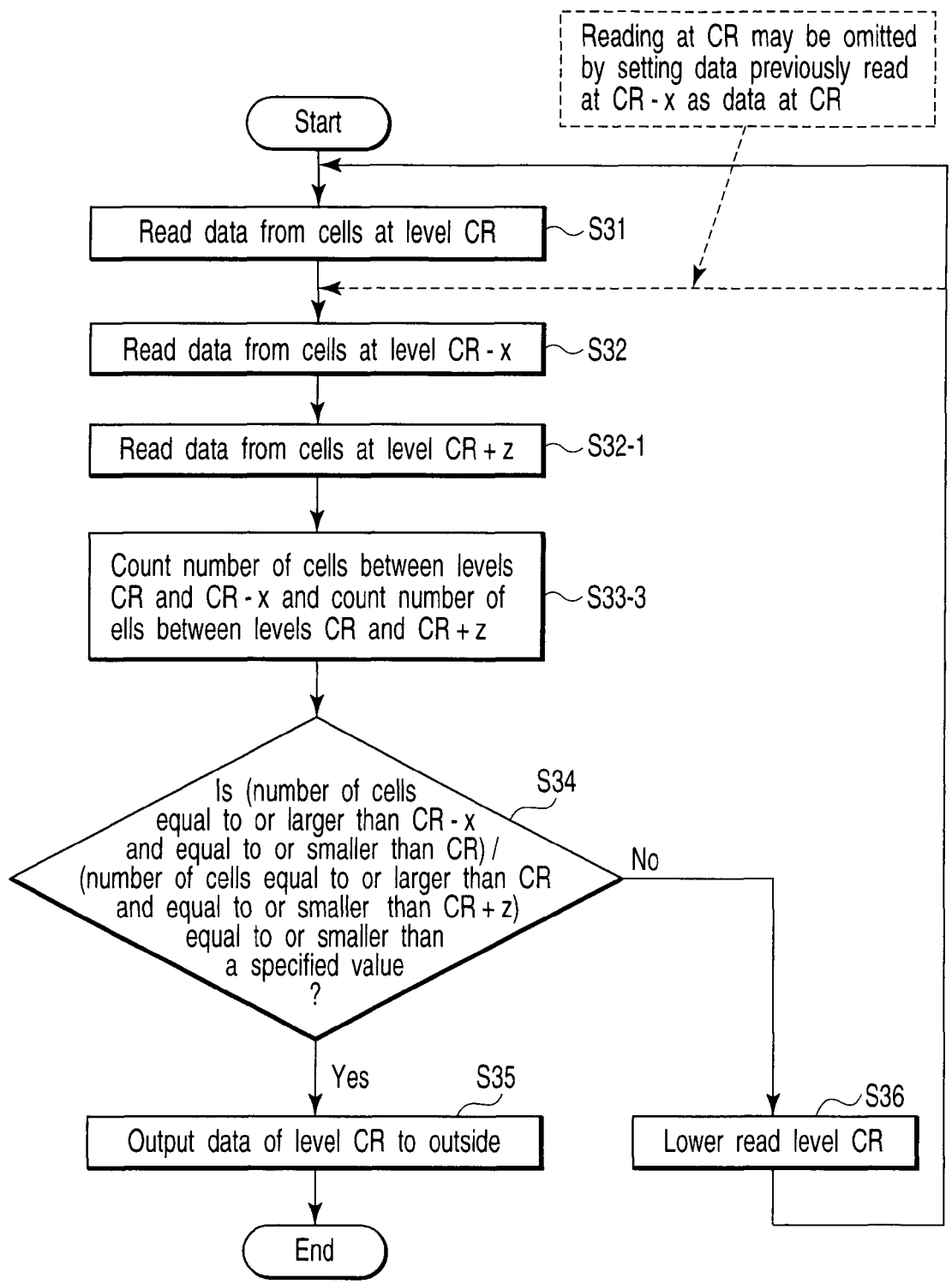
FIG. 19 is a flowchart to explain a first page sequence in a memory cell in the third embodiment.

In the sequence shown in FIG. 19, the same parts as those in the first embodiment are indicated by the same reference numbers. In steps S31, S32, after the data in the cell is read using the read levels (CR) and (CR−x), the data is read from the cell using a read level (CR+z) obtained by adding a specific value (z) (>(x)) to the read level (CR) (S32-1). Thereafter, for example, the host 11 counts not only the number of cells existing between the read levels (CR) and (CR−x) but also the number of cells existing between the read levels (CR) and (CR+z) (S33-3). Then, it is determined whether (number of cells equal to or larger than CR−x and equal to or smaller than CR)/(number of cells larger than CR and equal to or smaller than CR+z) is equal to or smaller than a specified value (S34-1). If the result of the determination has shown that the quotient is equal to or smaller than the specified value, the data read at the read level (CR) is output as regular data. If the result of the determination has shown that the quotient is equal to or larger than the specified value, the read level (CR) is lowered by a specific value (x) and the read operation is repeated (S36).

With the third embodiment, not only the number of cells existing between the read levels (CR) and (CR−x) but also the number of cells existing between the read levels (CR) and (CR+z) are counted. Then, whether (number of cells equal to or larger than CR−x and equal to or smaller than CR)/(number of cells larger than CR and equal to or smaller than CR+z) is equal to or smaller than the specified value is determined, thereby determining a read level. Accordingly, even when data does not exist evenly in each level (or threshold voltage distribution) of the cell, the data in the memory cell can be read accurately.

Fourth Embodiment

Figure 20:
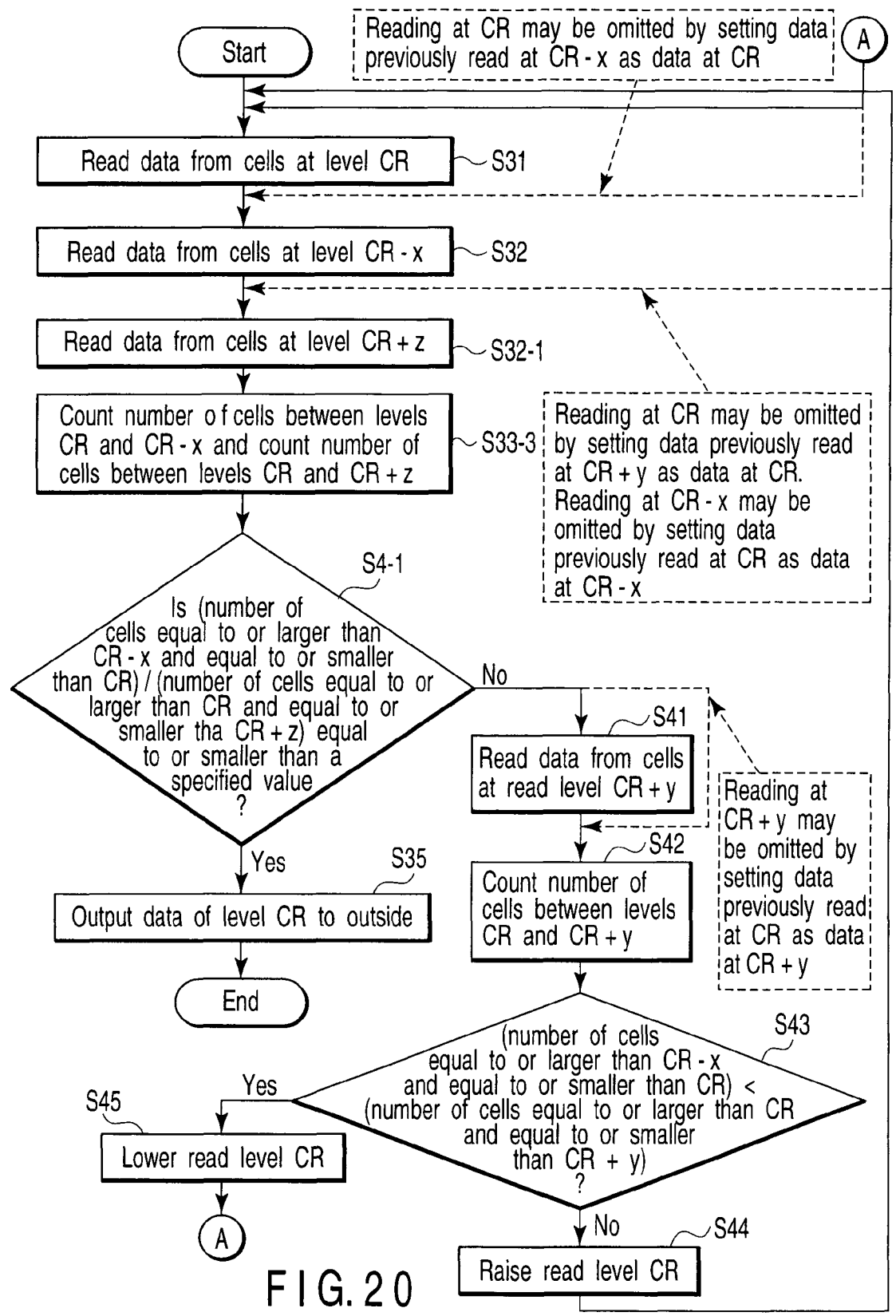
FIG. 20 is a flowchart to explain a first page read sequence in a memory cell according to a fourth embodiment of the invention.

FIG. 20 shows a read sequence of the first page in a fourth embodiment of the invention. The fourth embodiment is a modification of the second and third embodiments. The same parts as those in FIGS. 17 and 19 are indicated by the same reference numbers.

As shown in FIG. 20, in the fourth embodiment, as in the third embodiment, not only the number of cells existing between the read levels (CR) and (CR−x) but also the number of cells existing between the read levels (CR) and (CR+z) are counted. Then, whether (number of cells equal to or larger than CR−x and equal to or smaller than CR)/(number of cells larger than CR and equal to or smaller than CR+z) is equal to or smaller than a specified value is determined (steps S31 to S34-1).

If the result of the determination has shown that the quotient is neither equal to nor smaller than the specified value, the data is read using the read level (CR+y) as in the second embodiment. Then, it is determined whether the expression (number of cells equal to or larger than CR−x and equal to or smaller than CR)<(number of cells larger than CR and equal to or smaller than CR+y) is satisfied (steps S42 and S43). If the result of the determination has shown that the expression has been satisfied, the read level is lowered and reading is done (control proceeds to step S31 or S32). If the expression has not been satisfied, the read level is raised and reading is done (control proceeds via step S44 to step S31 or S32-1).

With the fourth embodiment, even when the read level is in the lower one of the two threshold voltage distributions adjacent to each other and the threshold voltage distributions differ in percentage, the data in the memory cell can be read reliably.

In the first to fourth embodiment, after the count or the ratio of counts is compared with a specified value, the read level is increased or decreased by the same level as (x) or (y) used in the determination and reading is done again. However, the invention is not limited to this.

Figure 21:
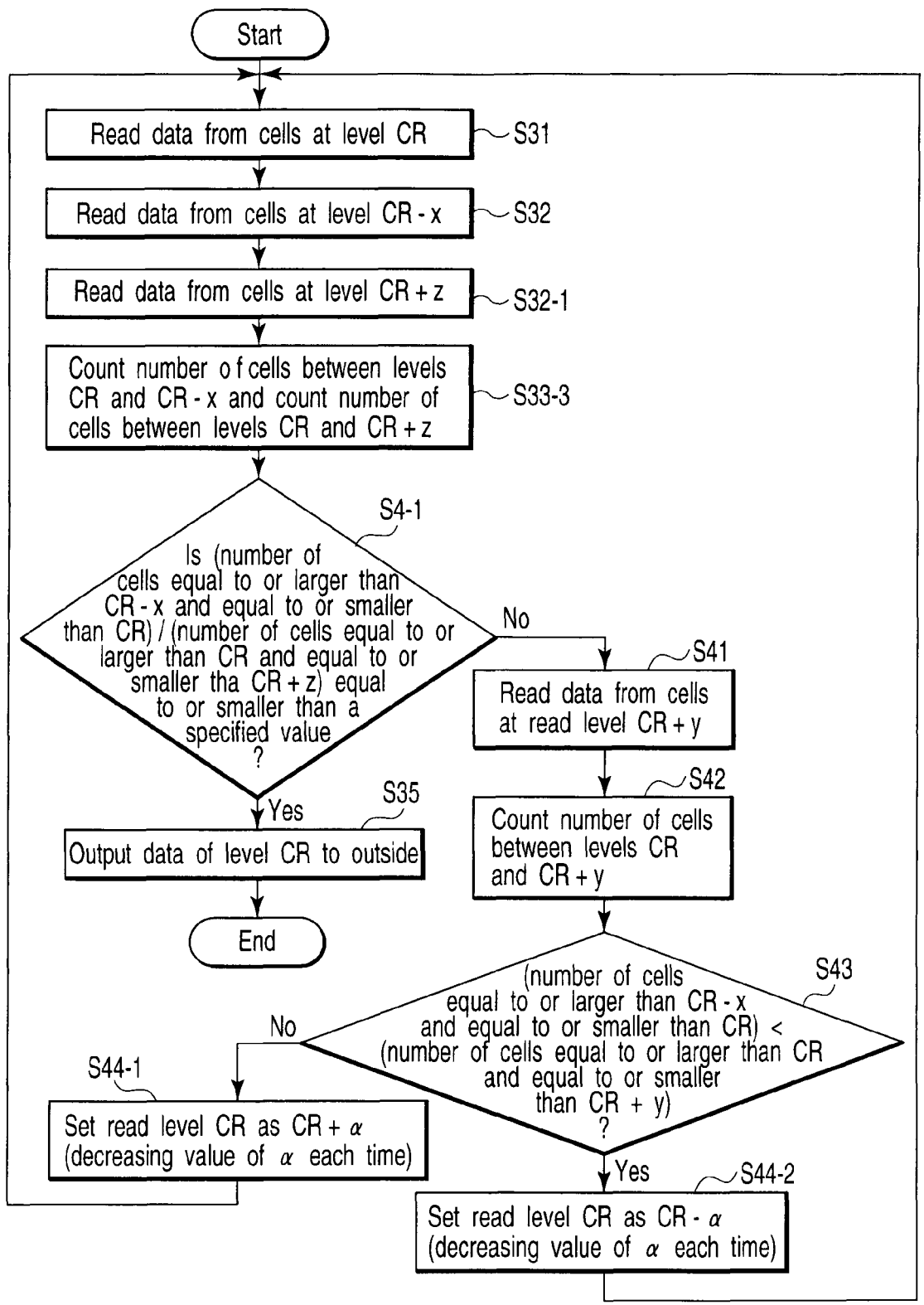
FIG. 21 is a flowchart to explain a first page read sequence in a memory cell according to a modification of the first to fourth embodiments.

FIG. 21 shows a modification of the first to fourth embodiments, taking the fourth embodiment as an example. In the modification, as shown in steps S44-1 and S44-2 of FIG. 21, the read level CR is set and reading is done again. Specifically, in step S44-1, the read level CR is set at CR+α. In step S44-2, the read level CR is set at CR−α. The value of α is, for example, a value equal to or smaller than x, which is set smaller each time reading is done.

As described above, by gradually decreasing the value added to or subtracted from the read level CR, that is, the value of α, and repeating the read operation, the optimum read level can be set. In this example, too, when reading is done repeatedly, the result may not converge. In this case, a maximum value is set for the repeat count. When the repeat count has reached the maximum value, the operation is terminated.

As in the first embodiment, in the second to fourth embodiments, the count of the number of cells and the comparison between the count and the reference value are not restricted to the host 11 and may be made at, for example, the control signal and control voltage generator circuit 7.

Fifth Embodiment

Figure 22:
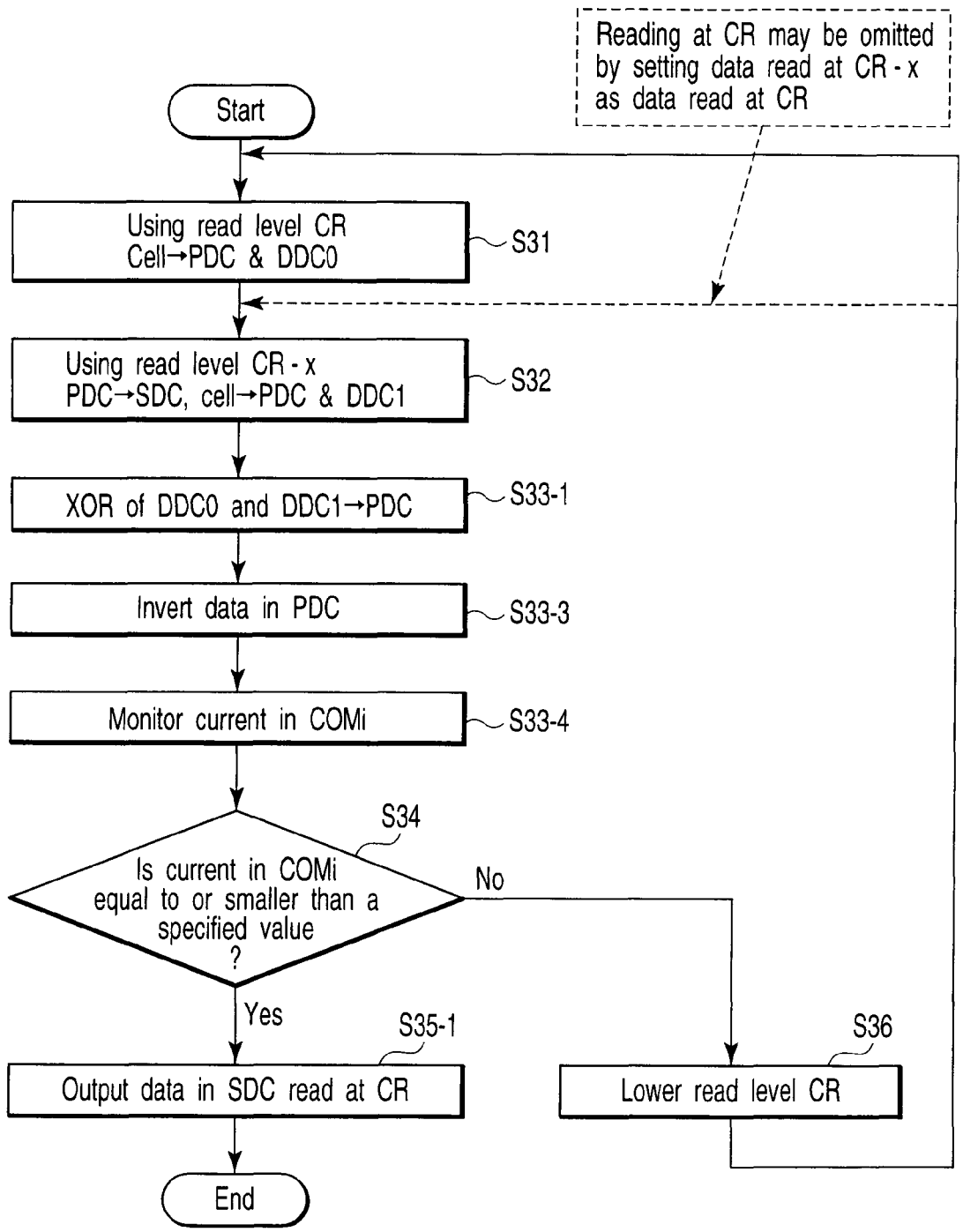
FIG. 22 is a flowchart to explain a first page read sequence in a memory cell according to a first modification of the first embodiment.

FIG. 22 shows a first modification of the first embodiment. In FIG. 22, the same parts as those of FIG. 15 are indicated by the same reference numbers.

In the first embodiment, the data read at the read level (CR) has been XORed with the data read at the read level (CR−x). The result has been output from the SDC to the host 11, which has counted the number of data "1". Since data has been output in units of one bit to several bits and counted, this has caused the problem of taking time. When the PDC of the data storage circuit 10 shown in FIG. 8 has latched data "0", node N1b is at the high level. Therefore, when signal CHK2n and signal CHK1 are made high, the potential on the wiring line COMi drops. The wiring line COMi is connected to all the data storage circuits 10. Consequently, current flows according to the number of data storage circuits 10 whose node N1b is at the high level. Accordingly, monitoring the current flowing through the wiring line COMi makes it possible to detect the number of data "1" obtained by XORing the result of reading at the read level (CR) with the result of reading at the read level (CR−x).

Specifically, as shown in FIG. 22, after the result of XOR is transferred to the PDC in step S33-1, the data in the PDC is inverted (S33-3). Thereafter, the current in the wiring line COMi is monitored (S33-4). As a result, if the value of current in the wiring line COMi is equal to or smaller than a specified value, the data in the SDC is output since the data read at the read level (CR) has been latched in the SDC (S35-1). If the current in the wiring line COMi is neither equal to nor smaller than the specified value, the read level CR is lowered by (x) (S36) and the read operation is carried out again.

The above configuration produces the same effect as that of the first embodiment. Moreover, the host 11 has only to compare the value of current in the wiring line COMi with the specified value and need not count the number of data "1" obtained by XOR supplied from the data storage circuit 10, which makes the determining operation faster.

The explanation has been given by modifying the first embodiment. Similarly, the second to fourth may be modified.

Sixth Embodiment

Figure 23:
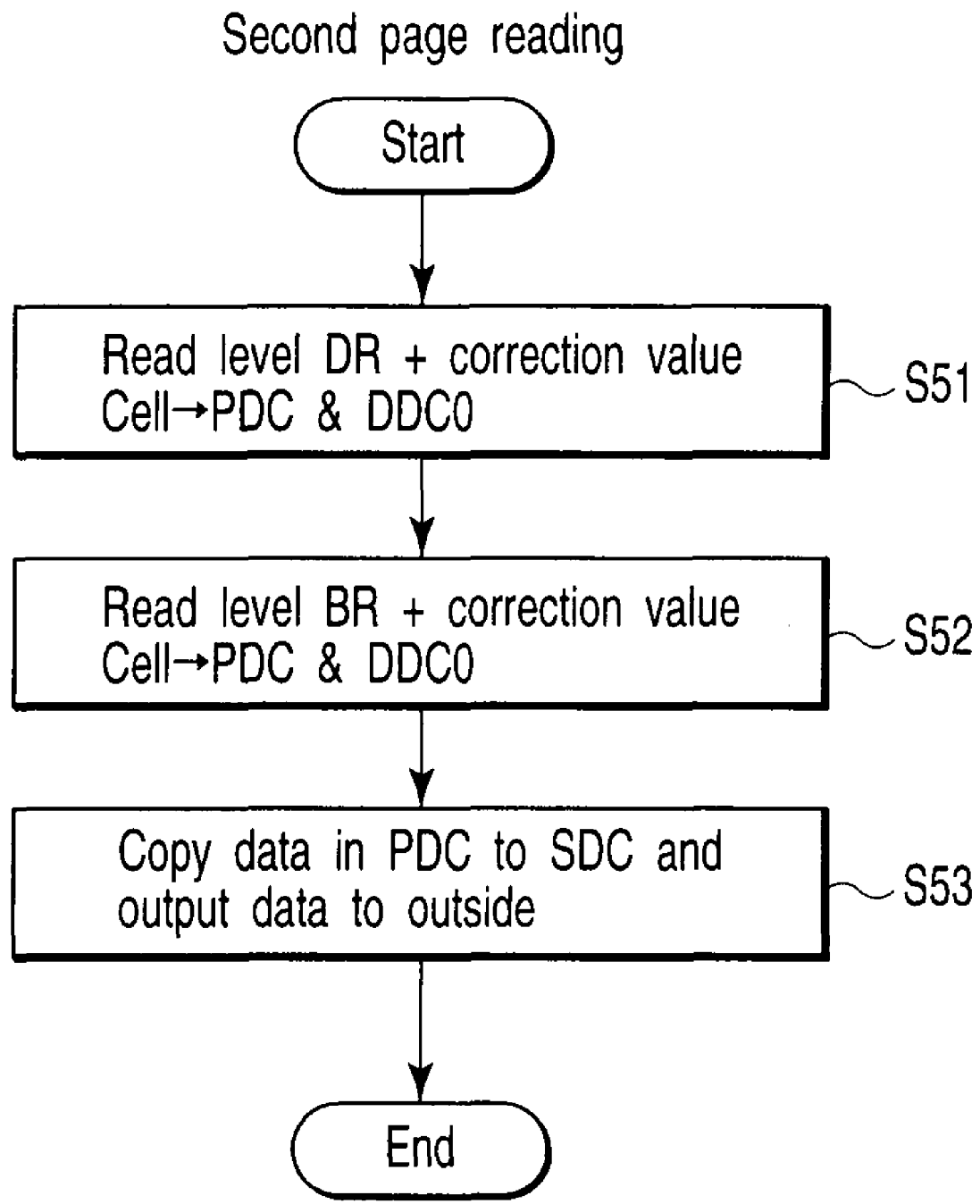
FIG. 23 is a flowchart to explain a second page read sequence.

FIG. 23 shows a read sequence of the second page. As shown in FIG. 9B, the second page is read by supplying a potential (BR) or (DR) as the read level to the selected word line. When reading is done at the read levels (BR) and (DR), the read levels (BR) and (DR) are corrected according to the correction value of the read level CR detected in the first page read operation.

Specifically, data "2", "3", "4" on the first page have been written simultaneously. For this reason, the interval between the data items is almost the same. Accordingly, when the first page is read, the correction value of the detected read level (CR) is added to the read levels (BR) and (DR), which enables the read levels (BR) and (DR) to be set optimally.

The correction value is set as follows. For example, when the first page is read, if the data read at the read level CR is output, the correction value is "0". If the data read at the read level CR−x is output, the correction value is "−x".

When the second page of FIG. 23 is read, first, the data is read from a plurality of memory cells connected to the selected word line using the read level (DR)+the correction value. These data items are latched in the PDC of the corresponding data storage circuit and DDC0 (S51). Thereafter, the data is read from a plurality of memory cells connected to the selected word line using the read level (BR)+the correction value. These data items are latched in the PDC of the corresponding data storage circuit and DDC0 (S52). Then, the data in the PDC is copied to the SDC and output to the outside (S53).

With the sixth embodiment, the correction value obtained in the first page read operation is added to the read levels (BR) and (DR) used in the second page read operation. This enables the data on the second page to be read at the optimum read level. Moreover, unlike in the first page operation, there is no need to detect the optimum read level. Accordingly, the second page read operation can be prevented from delaying.

Of course, as in the first page read sequence, in the second page read sequence, a correction value may be determined to detect the optimum read level for each of the read levels (BR) and (DR) and the data may be read using the detected read levels.

Furthermore, when control is so performed that the same block is written to simultaneously, correction values may be close to each other. In such a case, the correction value found in reading word line WL0 may be used to read the other word lines WL1 to WL31 in the same block. By doing this, the reading speed can be prevented from decreasing.

Seventh Embodiment

In the first to sixth embodiments, the read operation has been explained. In a seventh embodiment of the invention, an improvement in the program operation will be explained.

As a method of narrowing the threshold voltage distribution width after writing, while suppressing an increase in the write time, the quick-pass write (QPW) method has been proposed. In the QPW method, in the next and later write operations, an intermediate potential is applied to the bit lines of the cells which have exceeded a level lower than the original verify level to decrease the magnitude of writing, which enables a fluctuation in the threshold voltage to be made smaller and the threshold voltage distribution to be made narrower.

Figure 25:
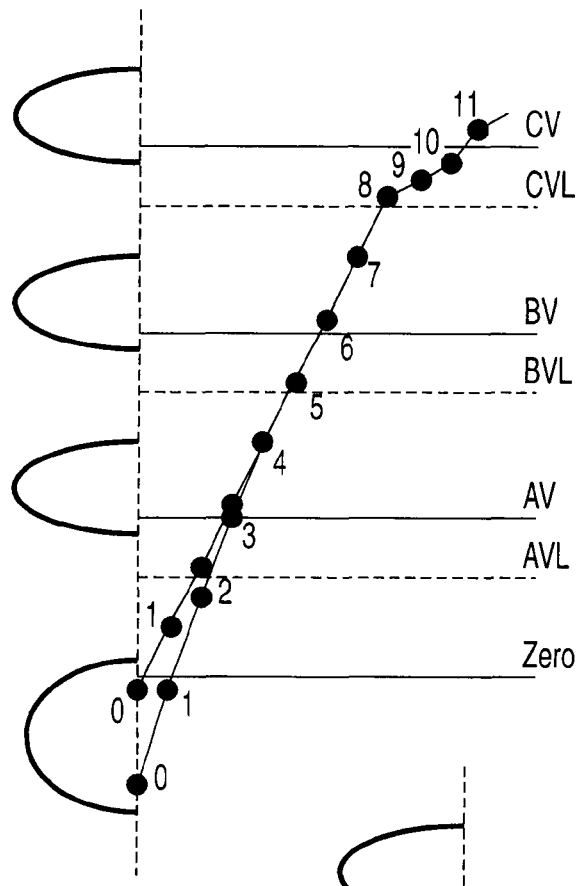
FIG. 25 shows program pulse voltages applied to a cell when writing is done by the QPW method and changes in the threshold voltage.

FIGS. 24 and 25 schematically show the QPW method. In the QPW method, as in the aforementioned program operation, after the data is loaded into each data storage circuit 10, a program operation is carried out (S51, S52). In a verify operation at each level, the word line potential is set to a level (AVL, BVL, CVL) lower than the original verify level and a first verify operation is carried out (S53, S54, S55). As a result of the verify operation, when the level (AVL, BVL, CVL) has not been reached, the program voltage Vpgm is increased by a specific voltage and the program operation and verify operation are carried out again (S56, S57, S52).

If the threshold voltage of the memory cell has reached a level (AVL, BVL, CVL) lower than the original verify level, an intermediate potential is supplied to the bit line in the next write operation to decrease the potential difference between the channel of the cell and the control gate, which weakens writing and makes smaller a change in the threshold voltage of the cell. In this state, the write operation and verify operation are repeated until the original verify level (AV, BV, CV) has been reached.

As described above, the QPW method generally requires two verify operations: a verify operation using a level lower than the original write verify level and a verify operation using the original verify level. This causes a problem: the verify time doubles or almost doubles.

FIG. 25 shows a program pulse voltage applied to the cell and changes in the threshold voltage after the program pulse voltage is applied when level "C" is written in the QPW method. As seen from FIG. 25, after the threshold voltage of the cell has exceeded a lower verify level CVL, an increment in the program pulse voltage is decreased to weaken writing. As a result, it is seen that a change in the threshold voltage of the cell decreases.

Figure 27:
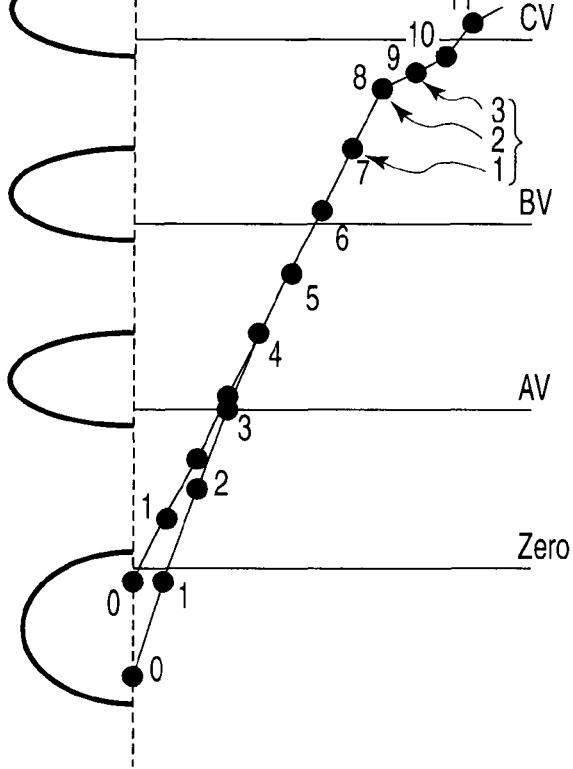
FIG. 27 shows program pulse voltages applied to a cell when writing is done and changes in the threshold voltage in the seventh embodiment.

FIG. 26 shows a program sequence in the seventh embodiment. FIG. 27 shows changes in the threshold voltage after each program pulse has been applied to a cell in which level "C" has been written. In FIG. 26, the same parts as those of FIG. 24 are indicated by the same reference numbers. Only what differs from FIG. 4 will be explained. In the seventh embodiment, three threshold voltages are written simultaneously using verify levels (AV, BV, CV).

As shown in FIG. 26, in the seventh embodiment, in a verify operation at each level, only a verify operation (S58, S59, S60) using the original verify level (AV, BV, CV) is carried out. In the verify operation, after a verify level (BV) one level lower than the verify level corresponding to the threshold voltage of the cell to be written to has been exceeded, writing is done, while stepping up the program voltage Vpgm. When the number of times the writing was done has exceeded three, an intermediate potential is supplied to the bit line to weaken the writing in the next and later program operations (S71). In this state, a verify operation is carried out at level CV (S59). As a result, if the threshold voltage of the cell has not reached level CV, the PDC is at the low level (S56). Therefore, the program voltage is stepped up (S57) and weak writing is done again (S71). This operation is repeated until all the PDCs have gone to the high level.

In this operation, when a verify operation is carried out at level CV, if writing has been completed at the verify level (AV) two levels below, the verify operation can be skipped. In the case of a verify operation at the lowest verify level (AV), there is no level below this. Therefore, in step S58 of FIG. 26, for example, a verify operation at level AV may be carried out twice in such a manner that a verify operation (AVL) at a lower verify level is carried out and then a verify operation (AV) at the original verify level is carried out.

In the seventh embodiment, as shown in FIG. 27, in the cell written at level "C", after verify level BV of level "B" (verify level one level lower than level "C") has been exceeded, an intermediate potential is applied to the bit line to weaken the writing in an n-th and later write operation, for example, a third and later write operation (in FIG. 27, a ninth and later write operation). This reduces a change in the threshold voltage.

With the seventh embodiment, after the verify level one level lower than the verify level to be written has been exceeded, writing is weakened in the n-th and later write operations. For this reason, the verify time can be shortened as compared with a case where two verify operations (i.e., a verify operation at the original verify level and a verify operation at a verify level lower than the original verify level) are carried out in each verifying process as in a general QPW method. This effect becomes more noticeable when 2-bit 4-level or more data is stored.

While in the seventh embodiment, the n-th and later write operations have been the third and later write operations (n=3), the invention is not limited to this and the value of n may be set to the optimum number of times according to the evaluation.

In the seventh embodiment, processing after the verify level one level lower than the verify level is written has been exceeded is described. However, it is also possible to consider arbitrary levels instead of limiting the level to the one level lower. After n-th write operation, write was weakened in this embodiment, but may be stopped instead.

As regards the writing to a cell at a level C, a verify operation at level C was not carried out, and the writing was weakened or stopped after the n-th writing after exceeding the level B. However, the writing at the level B and the writing at the level C is carried out without verify operations at the levels B and C. After exceeding the level A, the writing to a cell at a level B is weakened or stopped after the n-th writing. As regards the writing to a cell at the level C, the writing may be weakened or stopped after the m-th writing (n<m). Thus, instead of carrying out verify operations at the plurality of verify levels (2 or a greater natural number), it is possible to carry out a verify operation only at an arbitrary level (2 or a greater natural number) of a plurality of levels (2 or a greater natural number), and weaken or stop the writing at the other levels after writing of several numbers of times.

Eighth Embodiment

Figure 28:
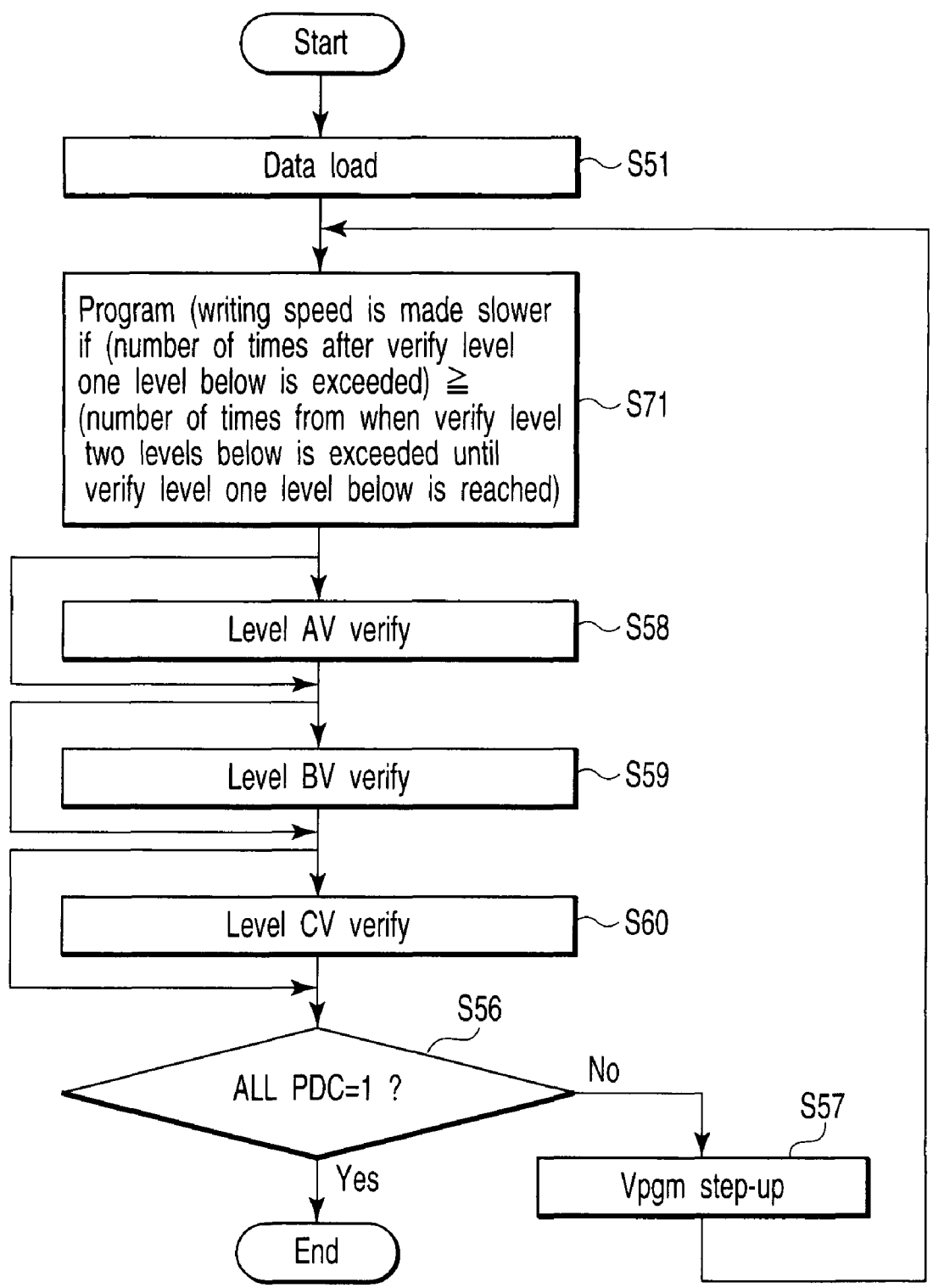
FIG. 28 is a flowchart to explain a program sequence according to an eighth embodiment of the present invention.

FIG. 28 is a flowchart to explain a program sequence in an eighth embodiment of the invention. FIG. 29 shows changes in the threshold voltage after each program pulse voltage is applied to a cell in which writing has been done at level "C". The eighth embodiment is a modification of the seventh embodiment. In FIG. 28, the same parts as those of FIG. 26 are indicated by the same reference numbers.

In the seventh embodiment, after the verify level one level lower than the verify level to be written has been exceeded, writing is weakened in the n-th and later write operations. In the eight embodiment, however, after a verify level two levels lower than the verify level to be written has been exceeded, the number of times k writing is done until the verify level one level lower than the verify level to be written has been reached is counted (here, three times). In an h-th write operation (h=k±α, α: correction value) since a verify level one level below was exceeded, an intermediate potential is applied to the bit line to weaken writing, thereby decreasing a fluctuation in the threshold voltage. For example, if α=0, the number of times "h" is 3.

Specifically, as shown in FIG. 29, when writing is done at level "C", the number of times writing is done until verify level BV has been reached since verify level AV was exceeded is counted. When counting is done for each of the cells written to, a circuit for counting the number of times is provided in the data storage circuit connected to each bit line. To find the average value of the cells simultaneously written to, for example, a counter is provided in the control signal and control voltage generator circuit 7 and the counter is used to count the number of times, for example, the program voltage Vpgm was stepped up. When the count of the counter is "k"=3, if "α" is set at "0", an intermediate potential is supplied to the bit line in the third write operation ("h"=3) from verify level BV, which weakens writing.

The number of times "h" is a value obtained by adding a correction value "α" to the count "k". Usually, however, the margin between the threshold voltages stored in the memory cells has to be larger as the level becomes higher in order to improve the data retention. Thus, it follows that (BV−AV)≦(DV−BV). For this reason, the number of times "h" and the count "k" are allowed to be almost the same.

The eighth embodiment counts the number of write times until one level lower than the verify level is written, after the two verify level lower has been exceeded. However, it is also possible to consider arbitrary levels instead of limiting the level to the two level lower and one level lower. After h-th write operation, writing was weakened, but may be stopped instead.

The eighth embodiment produces the same effect as that of the seventh embodiment. Moreover, with the eighth embodiment, even when there are cells written fast and cells written slow, each threshold voltage distribution can be written accurately.

Ninth Embodiment

Figure 30A:
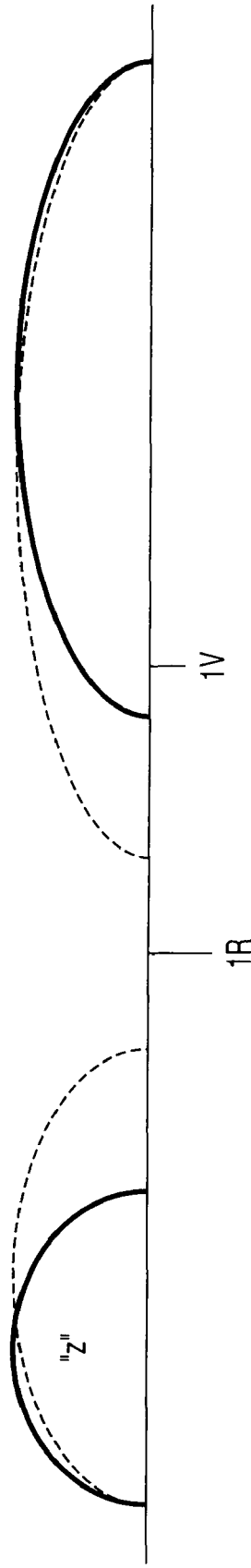
FIG. 30A shows a 2-level threshold voltage distribution when 1 bit is stored in a cell and FIG. 30B shows a 16-level threshold voltage distribution when 4 bits are stored in a cell.
Figure 30B:
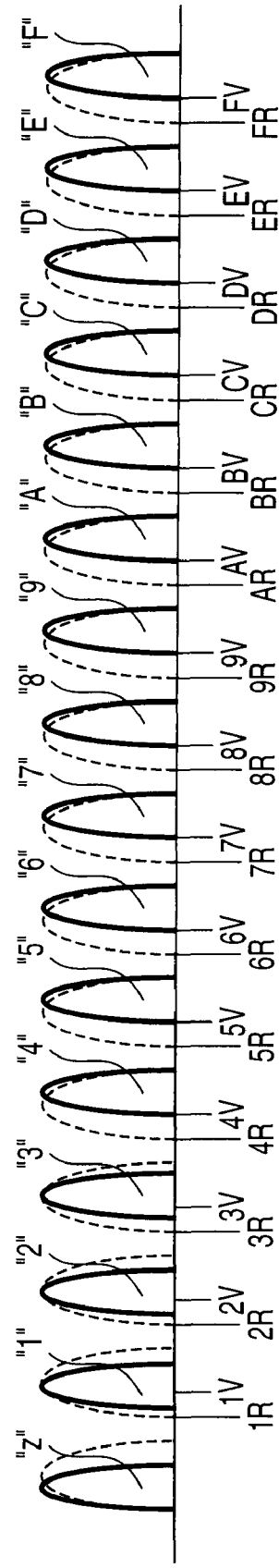

FIG. 30A shows a 2-level threshold voltage distribution when 1 bit is stored in a cell and FIG. 30B shows a 16-level threshold voltage distribution when 4 bits are stored in a cell. 16 levels have a merit of being capable of storing 4 bits in a cell. In this case, however, each threshold voltage distribution has to be written narrowly. For this reason, a write operation and a verify operation have to be carried out little by little repeatedly, which makes the writing speed very slow. In FIGS. 30A and 30B, the threshold voltage distributions shown by solid lines represent the state immediately after writing and the threshold voltage distributions shown by broken lines represent the state when they have been left for a long time. Since the threshold voltage distribution expands when being left for a long time, the data retention margin (margin between threshold voltage distributions) is small.

Figure 31:
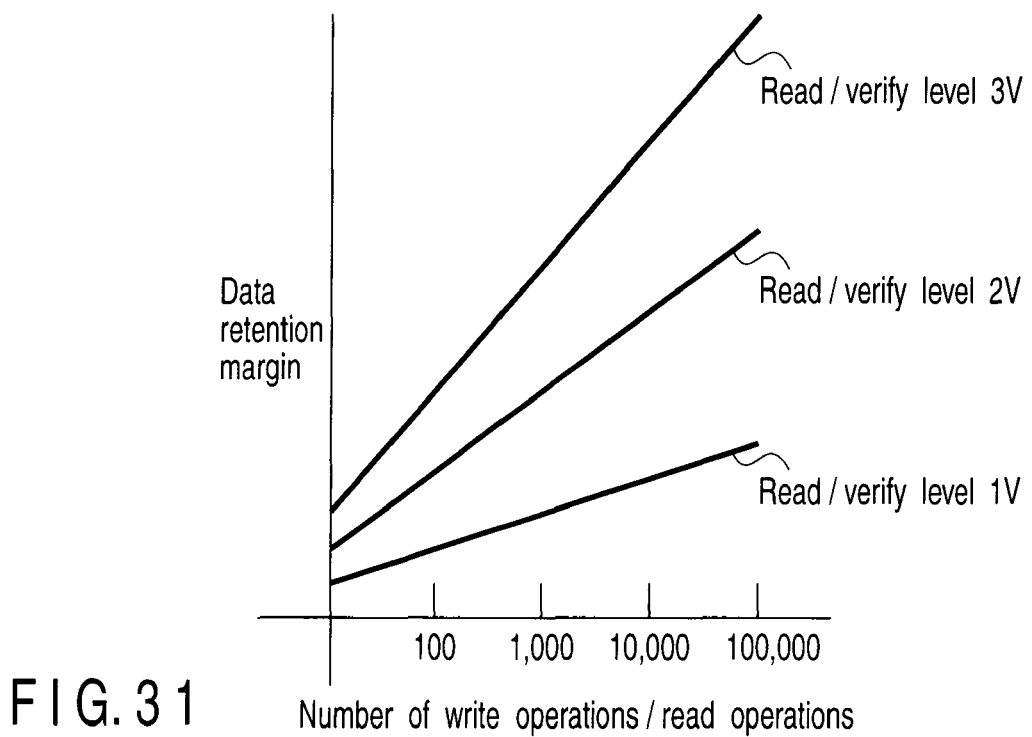
FIG. 31 shows the relationship between the number of times writing/erasing is done in a NAND flash memory and a data retention margin.

FIG. 31 shows the relationship between the number of times writing/erasing is done in a NAND flash memory and the necessary data retention margin. As seen from FIG. 31, as the number of times writing/erasing is done increases in the NAND flash memory, the necessary data retention margin increases. Accordingly, if the number of times writing/erasing is done in 2 levels is suppressed to 100,000 and the number of times writing/erasing is done in 16 levels is suppressed to 1,000, the necessary retention margin is allowed to be small. Therefore, these figures are considered to be specifications for suppressing the number of times writing/erasing is done.

Figure 32:
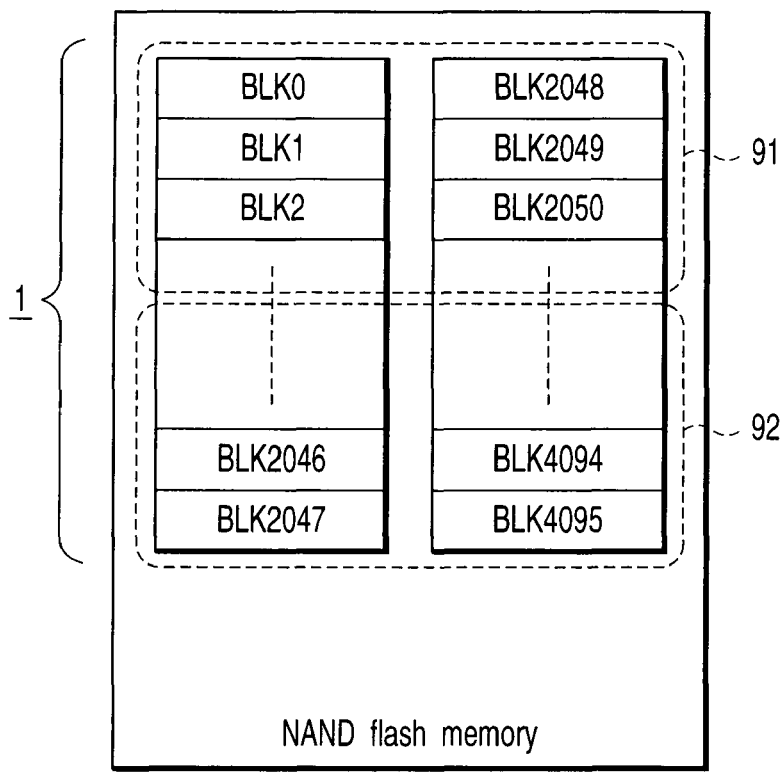
FIG. 32 schematically shows a NAND flash memory according to a ninth embodiment of the invention.

FIG. 32 schematically shows a NAND flash memory according to the ninth embodiment. The memory cell array 1 (corresponding to the memory cell array 1 of FIG. 2) of the NAND flash memory includes a plurality of blocks BLK0 to BLK 4095 which is an erasing unit. In the ninth embodiment, of the blocks, those included in a first area 91 enclosed by a broken line are used to store 2-level data. The blocks included in a second area 92 enclosed by a broken line are used to store 16-level data. For example, when data has to be written at high speed, data to be frequently written or erased is written to a 2-level data block included in the first area 91. Moreover, control is performed so as to write to the second area 92 data which is not required to be written at high speed and is written or erased less frequently. The selection control of the write areas is performed by, for example, the host 11. Specifically, the host 11 writes frequently rewritten data, such as system information updated each time data is rewritten, into the first area 91 and the other data into the second area 92.

With the ninth embodiment, the memory cell array 1 is divided into the first area 91 and the second area 92. A plurality of blocks included in the first area 91 are used as 2-level data storage blocks. A plurality of blocks included in the second area 92 are used as 16-level data storage blocks. This makes it possible to prevent the data retention margin from deteriorating and the writing speed from decreasing.

Figure 33:
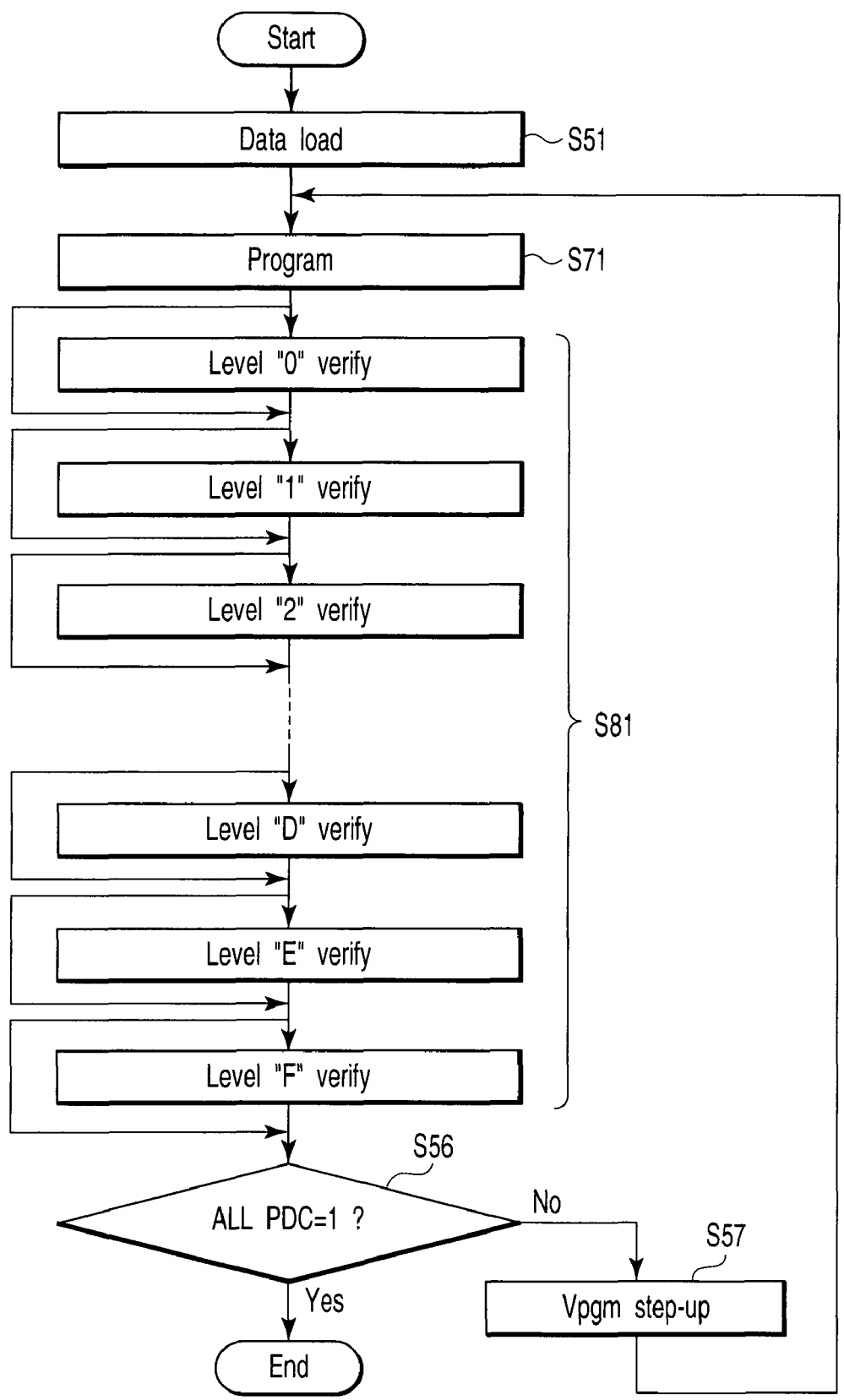
FIG. 33 is a flowchart to explain a write sequence when 16 levels are stored in a cell shown in FIG. 30B.

FIG. 33 is a flowchart to explain a write sequence when 16 levels are stored in the single cell shown in FIG. 30B. In this case, after one write operation, 16 verify operations are carried out (S81). The write operation and verify operations are repeated until all the cells simultaneously written to have passed the verify operations. If there is no cell in the level to be written, the verify operation may be skipped.

In die sort testing, it may be sufficient to evaluate only data on the lowest threshold voltage and the highest threshold voltage. FIG. 34 is a flowchart to explain a write operation in die sort testing. In this case, first a test command is input from the outside (S91). According to the test command, only level "0", level "1", and level "F" or only level "1" and level "F" are verified (S92). By doing this, the testing time can be shortened.

While in the testing, only level "0", level "1", and level "F" or only level "1" and level "F" have been verified, only an arbitrary one or several arbitrary ones of a plurality of levels may be verified by inputting a test command.

Tenth Embodiment

Figure 35:
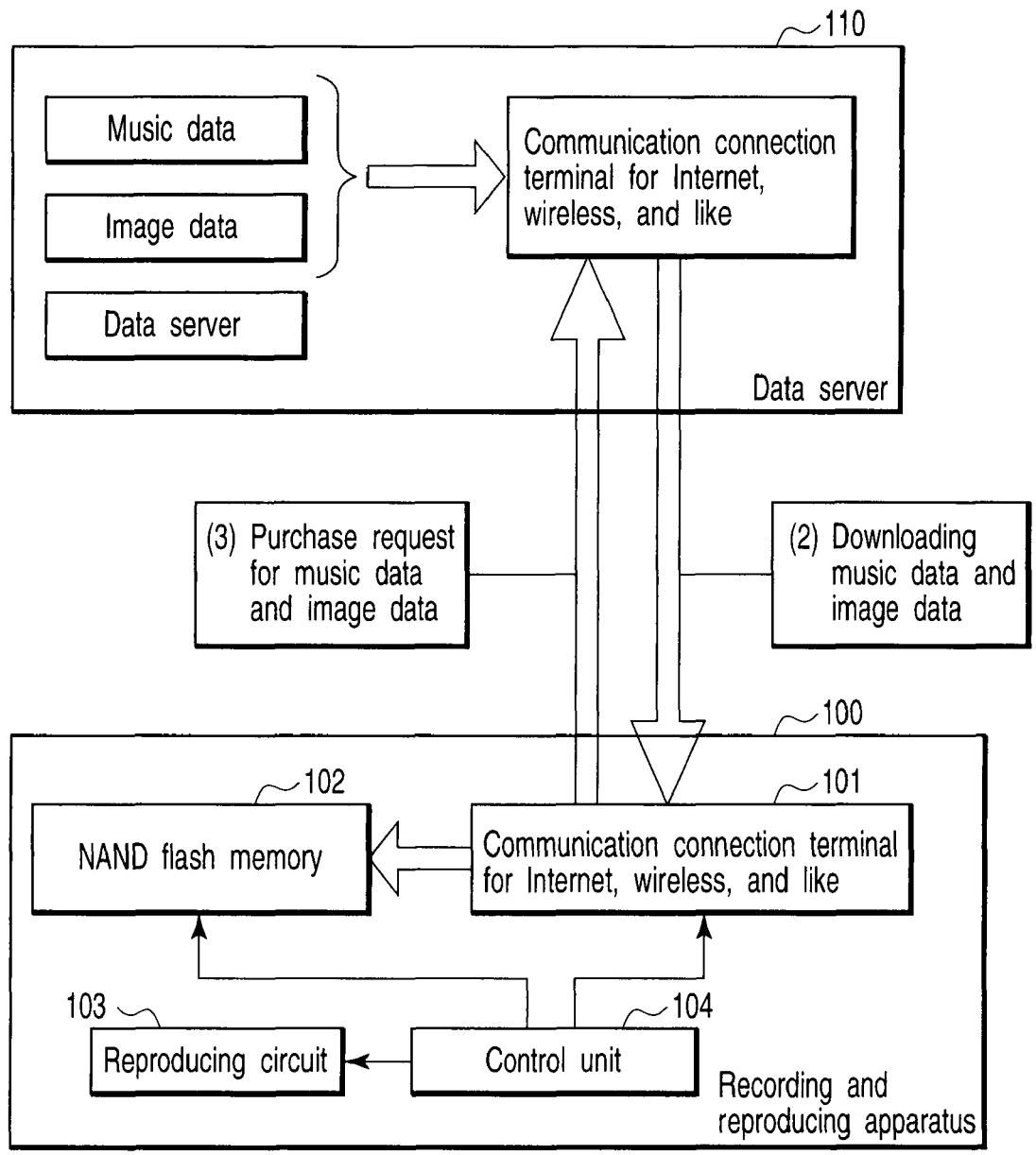
FIG. 35 shows a configuration when a NAND flash memory is applied to a recording and reproducing apparatus for music data or image data.

FIG. 35 shows a case where a NAND flash memory is applied to a recording and reproducing apparatus for multimedia data, such as music data or image data. The recording and reproducing apparatus 100, which is, for example, a personal computer or a mobile telephone, comprises communication means 101, such as Internet connection means or wireless communication means, a NAND flash memory 102, a reproducing circuit 103, and a control unit 104. These days, use of the recording and reproducing apparatus 100 enables music data or image data to be purchased from a data server 110. Specifically, when purchasing music data or image data, the user accesses the data server 11 via for example, the Internet or wireless communication means of the recording and reproducing apparatus 100 and makes a request to purchase music data or image data. According to the request, the data accumulated in the data server 110 is downloaded into the recording and reproducing apparatus 100 via communication means, such as the Internet. The data downloaded into the recording and reproducing apparatus 100 is stored in the NAND flash memory 102.

The amount of music data or image data may be very large. For this reason, it takes time to write data into the NAND flash memory 102. Moreover, when the NAND flash memory 102 stores, for example, 16-level data in a cell, a problem arises: it takes more time to write a large amount of data since the writing speed is slow.

Figure 36:
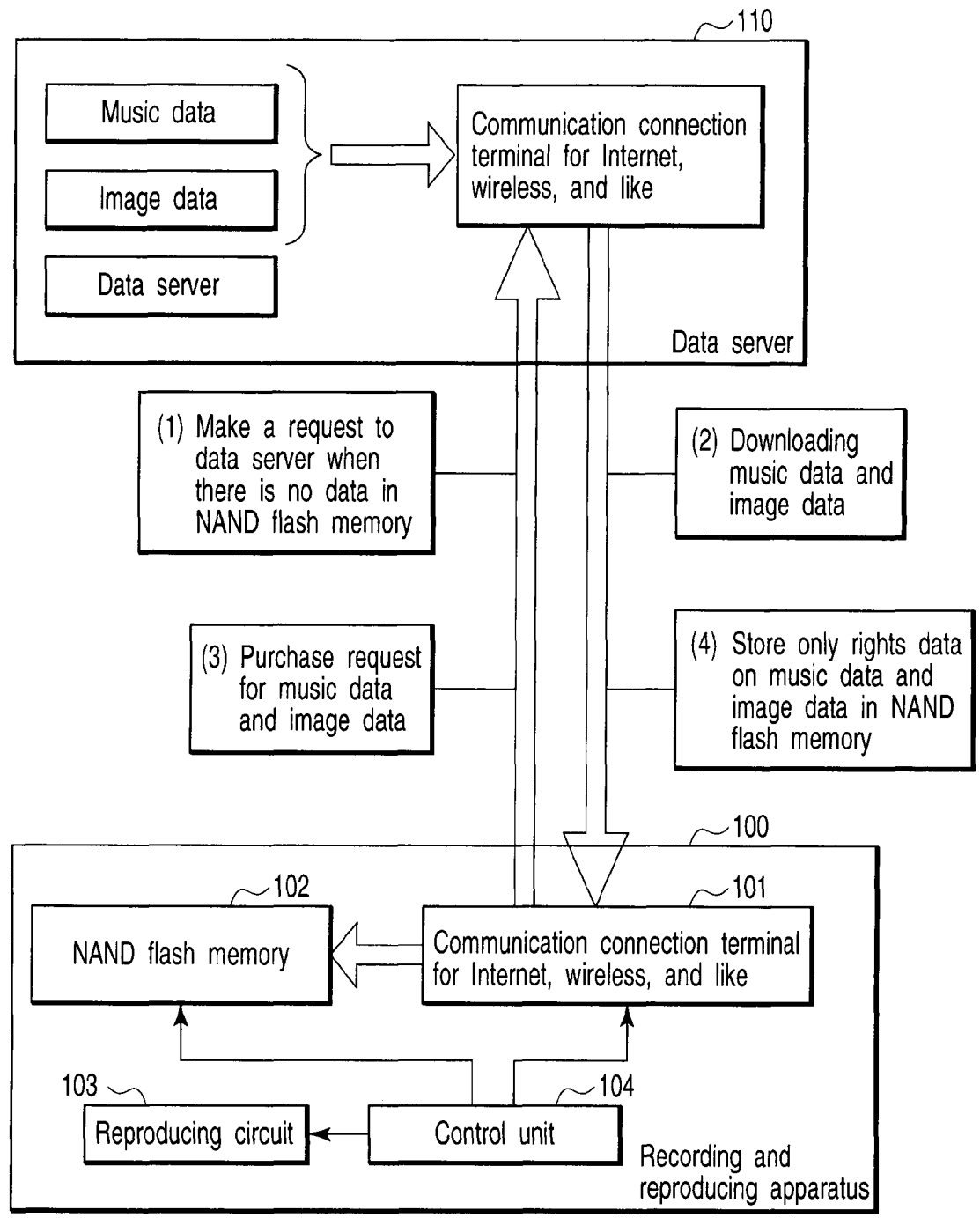
FIG. 36 shows a configuration when a NAND flash memory is applied to a recording and reproducing apparatus for music data or image data according to a tenth embodiment of the invention.
Figure 37:
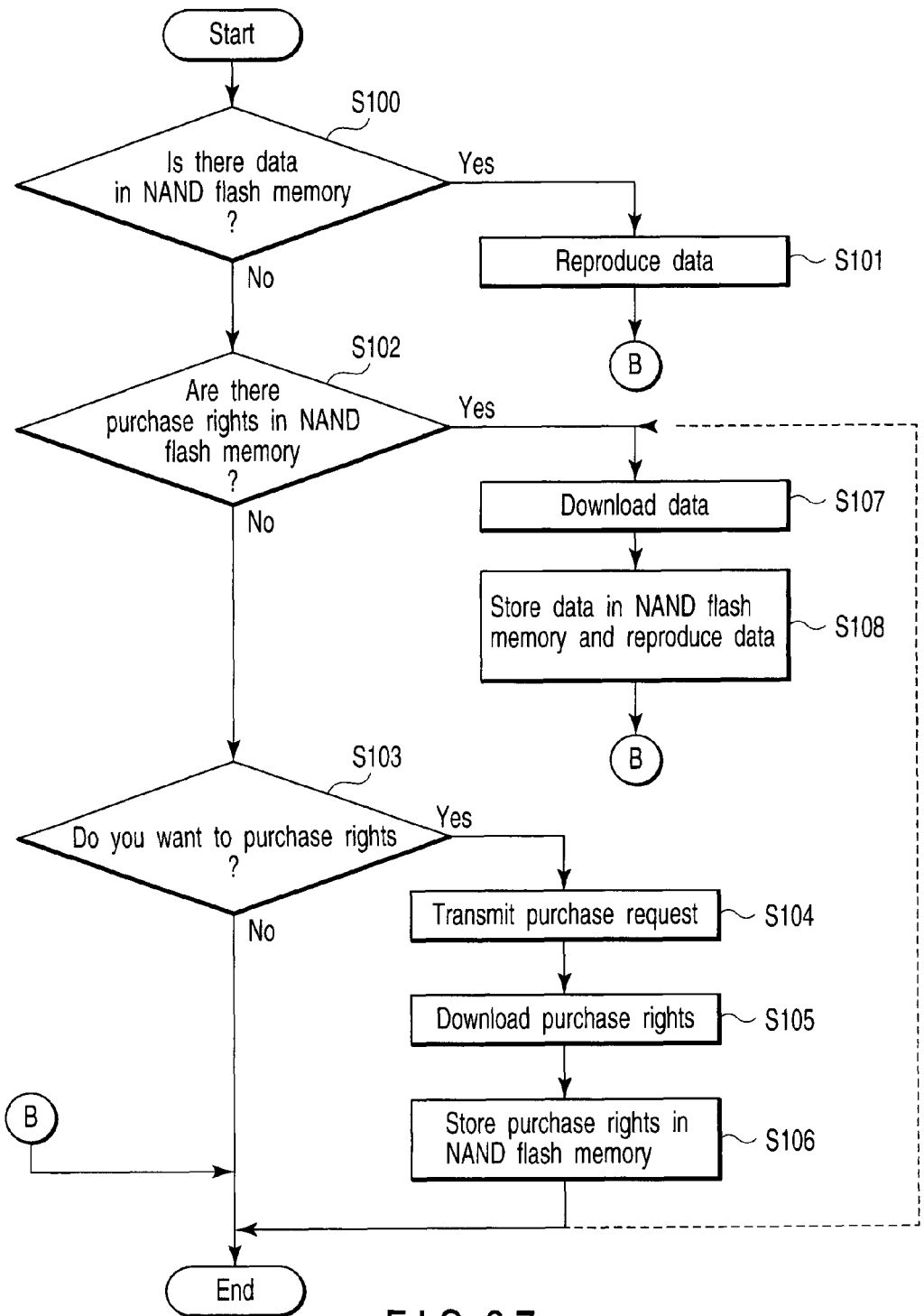
FIG. 37 is a flowchart to explain the recording and reproducing apparatus shown in FIG. 36.

FIGS. 36 and 37 are flowcharts to explain a method of downloading music data or image data, while reproducing the data in a tenth embodiment of the invention.

When the music data or image data stored in the NAND flash memory 102 is reproduced using the recording and reproducing apparatus 100, the control unit 104 of the recording and reproducing apparatus 100 searches the NAND flash memory 102 for music data or image data to be reproduced (S100). If there is music data or image data, the data is reproduced by a reproducing circuit 103 (S101).

If there is neither music data nor image data in the NAND flash memory 102, the control unit 104 searches the NAND flash memory 102 for purchase rights data (S102). If the result of the search has shown that there is no purchase rights data, the control unit 104 prompts the user to input information as to whether the user want to purchase data (S103). If the user wants to purchase data, the control unit accesses the data server 110 via the communication means 101, such as the Internet or wireless communication means, and transmits a request to purchase music data or image data the user wants to purchase (S104). If the data server 110 accepts the purchase request, the control unit 104 downloads purchase rights data from the data server 110 (S105) and stores the downloaded purchase rights data in the NAND flash memory 102 (S106). That is, at this time, only the purchase rights data whose amount is small is downloaded without downloading music data or image data whose amount is large. Consequently, it is possible to shorten the time required to download the purchase rights data and store the data in the NAND flash memory 102.

Thereafter, when the user reproduces music data or image data, it is determined whether there is purchase rights data in step S102 via step S100. In this case, since purchase rights data has been stored in the NAND flash memory 102, the control unit 104 accesses the data server 110 via the communication means 101 and downloads the music data or image data corresponding to the purchase rights data (S107). The downloaded data is not only stored in the NAND flash memory 102 but also reproduced (S108). Since the data reproducing time is much longer than the time required to write data into the NAND flash memory 102, there is no problem even when the NAND flash memory is written to, while the downloaded data is being reproduced.

The downloaded data is stored in, for example, a buffer circuit (not shown). The data stored in the buffer is not only reproduced but also written to the NAND flash memory 102.

Furthermore, as shown by a broken line, immediately after step S106, steps S107 and S108 may be executed.

With the tenth embodiment, when music data or image data is purchased, first, only purchase rights data whose amount of data is small is downloaded. When music data or image data is reproduced, the music data or image data corresponding to the purchase rights data is written to the NAND flash memory 102, while the music data or image data is being reproduced. This makes it possible to download music data or image data whose amount of data is large without taking into account the time required to write data.

In the ninth and tenth embodiment, the first to sixth embodiments may be applied to the operation of reading data and the seventh and eighth embodiments may be applied to the operation of writing data.

In each of the above embodiments, data to be written to the memory cells is not limited to 2 bits or 4 bits and may contain 3 bits or n bits equal to 5 bits or more.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which a plurality of memory cells connected to a plurality of word lines and to a plurality of bit lines are arranged in a matrix;
   a voltage generator circuit which generates potentials for the word lines and the bit lines;
   a data storage circuit which is connected to the bit lines and which stores data to be written to the memory cells or data read from the memory cells; and
   a control unit which reads data from a plurality of memory cells connected to one of the word lines in a read operation at a first level generated by the voltage generator circuit and in a read operation at a second level and which finds the number of cells included between the first level and the second level from the read data and, if the number is equal to or smaller than a specified value, determines the result of the read operation at the first level to be read data.

2. The semiconductor memory device according to claim 1, wherein the control unit changes the read level and carries out the read operation again when the number of memory cells included between the first level and the second level has exceeded the specified value.

3. The semiconductor memory device according to claim 1, wherein the second level is lower than the first level.

4. The semiconductor memory device according to claim 1, wherein the control unit lowers the first and second levels and carries out the read operation again when the number of memory cells included between the first level and the second level is equal to or larger than the specified value.

5. The semiconductor memory device according to claim 3, wherein, when the number of memory cells included between the first level and the second level is equal to or larger than the specified value, the control unit does reading at a third level lower than the second level and finds the number of memory cells included between the second level and the third level and, when the number of memory cells included between the second level and the third level is equal to or smaller than the specified value, determines the result of the read operation at the second level to be read data.

6. The semiconductor memory device according to claim 3, wherein the control unit carries out a read operation at a fourth level higher than the first level, finds the number of memory cells included between the first level and the fourth level and, when the number of memory cells included between the first level and the second level is equal to or larger than the specified value and the number of cells between the first level and the second level is smaller than the number of cells between the first level and the fourth level, lowers the read level and carries out the read operation again.

7. The semiconductor memory device according to claim 3, wherein the control unit carries out a read operation at a fourth level higher than the first level, finds the number of memory cells included between the first level and the fourth level and, when the number of memory cells included between the first level and the second level is equal to or larger than the specified value and the number of cells between the first level and the second level is larger than the number of cells between the first level and the fourth level, raises the read level and carries out the read operation again.

8. A semiconductor memory device comprising:
a memory cell array in which a plurality of memory cells connected to a plurality of word lines and to a plurality of bit lines are arranged in a matrix;
a voltage generator circuit which generates potentials for the word lines and the bit lines;
a data storage circuit which is connected to the bit lines and which stores data to be written to the memory cells or data read from the memory cells; and
a control unit which, in a read operation at a first level generated by the voltage generator circuit, a read operation at a second level, and a read operation at a third level higher than the first level, finds the number of memory cells included between the first level and the second level and the number of memory cells included between the first level and the third level and which determines the result of the read operation at the first level to be read data when (number of memory cells included between first level and second level)/(number of memory cells included between first level and third level) is equal to or smaller than a specified number.

9. The semiconductor memory device according to claim 8, wherein the control unit changes the read level and carries out the read operation again when (number of memory cells included between first level and second level)/(number of memory cells included between first level and third level) exceeds the specified number.

10. The semiconductor memory device according to claim 8, wherein the second level is lower than the first level.

11. The semiconductor memory device according to claim 8, wherein the control unit lowers the first and second levels and carries out the read operation again when (number of memory cells included between first level and second level)/(number of memory cells included between first level and third level) is equal to or larger than the specified number.

12. The semiconductor memory device according to claim 10, wherein, when (number of memory cells included between first level and second level)/(number of memory cells included between first level and third level) is equal to or larger than the specified number, the control unit does reading at a fourth level lower than the second level and finds the number of memory cells included between the second level and the fourth level and, when the number of memory cells included between the second level and the fourth level is equal to or smaller than the specified number, determines the result of the read operation at the second level to be read data.

13. The semiconductor memory device according to claim 10, wherein the control unit carries out a read operation at a fifth level higher than the first level, finds the number of memory cells included between the first level and the fifth level and, when (number of memory cells included between first level and second level)/(number of memory cells included between first level and third level) is equal to or larger than the specified number and the number of memory cells between the first level and the second level is smaller than the number of cells between the first level and the fifth level, lowers the read level and carries out the read operation again.

14. The semiconductor memory device according to claim 10, wherein the control unit carries out a read operation at a fifth level higher than the first level, finds the number of memory cells included between the first level and the fifth level and, when (number of memory cells included between first level and second level)/(number of memory cells included between first level and third level) is equal to or larger than the specified number and the number of memory cells between the first level and the second level is larger than the number of cells between the first level and the fifth level, raises the read level and carries out the read operation again.

15. A semiconductor memory device comprising:
a memory cell array in which a plurality of memory cells connected to a plurality of word lines and to a plurality of bit lines are arranged in a matrix;
a voltage generator circuit which generates potentials for the word lines and the bit lines;
a data storage circuit which is connected to the bit lines and which stores data to be written to the memory cells or data read from the memory cells; and
a control unit which controls the voltage generator circuit and the data storage circuit and which sets the threshold voltage of the memory cells at a first level in an erase operation and, according to externally input write data, sets the threshold voltage of the memory cells at the first level, a second level, . . . , an n-th level ($n=2^k$) by repeating a write and verify operation, stores k bits of data, counts a j number of write operations (j is a natural number) for the cells that have exceeded an (h−b)-th level ($1 \leq b < h$, b is a natural number) of the cells to be written at an h-th level ($h \leq n$) after the (h−b)-th level has been exceeded, and makes the writing speed slower or no writing in the j-th and later write operations.

16. A semiconductor memory device comprising:
a memory cell array in which a plurality of memory cells connected to a plurality of word lines and to a plurality of bit lines are arranged in a matrix;
a voltage generator circuit which generates potentials for the word lines and the bit lines;
a data storage circuit which is connected to the bit lines and which stores data to be written to the memory cells or data read from the memory cells; and
a control unit which controls the voltage generator circuit and the data storage circuit and which sets the threshold voltage of the memory cells at a first level in an erase operation and, according to externally input write data, sets the threshold voltage of the memory cells at the first level, a second level, . . . , an n-th level ($n=2^k$) by repeating a write and verify operation, stores k bits of data, counts an i number of write operations (i is a natural number) from when an (h−c)-th level is exceeded until an (h−b)-th level ($1 \leq b < c < h$, b and c are a natural number) is exceeded with respect to the cells to be written at an h-th level ($h \leq n$), and makes the writing speed slower or no writing in the j-th and later write operations (j=i+α) (α is a natural number including "0") for the cells that have exceeded the (h−b)-th level in a write operation at the h-th level.

17. A semiconductor memory device comprising:
a memory cell array in which a plurality of memory cells connected to a plurality of word lines and to a plurality of bit lines are arranged in a matrix;
a voltage generator circuit which generates potentials for the word lines and the bit lines;
a data storage circuit which is connected to the bit lines and which stores data to be written to the memory cells or data read from the memory cells; and a control unit which controls the voltage generator circuit and the data storage circuit and which sets the threshold voltage of the memory cells at a first level in an erase operation and, according to externally input write data, sets the threshold voltage of the memory cells at the first level, a second level, . . . , an n-th level ($n=2^k$) by repeating a write and verify operation in a write operation, stores k bits of data in the memory cells, carries out a verify operation for an n number of levels, the first level, second level, . . . , n-th level ($n=2^k$), in the write operation, and carries out only a verify operation for an h number of levels (h<n) of the n number of levels in the write operation after the input of a first command.

18. The semiconductor memory device according to claim 17, wherein the control unit carries out only the first level or n-th level verify operation in the write operation after the input of the first command.

* * * * *